US012712534B2

(12) United States Patent
Lee

(10) Patent No.: US 12,712,534 B2
(45) Date of Patent: Aug. 18, 2026

(54) LEVEL SHIFTER AND MEMORY DEVICE INCLUDING THE SAME

(71) Applicant: SAMSUNG ELECTRONICS CO., LTD., Suwon-si (KR)

(72) Inventor: Jisoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/631,852

(22) Filed: Apr. 10, 2024

(65) Prior Publication Data

US 2025/0175164 A1 May 29, 2025

(30) Foreign Application Priority Data

Nov. 23, 2023 (KR) ........................ 10-2023-0164432

(51) Int. Cl.
*H03K 3/356* (2006.01)
*H03K 19/0185* (2006.01)

(52) U.S. Cl.
CPC . *H03K 3/356182* (2013.01); *H03K 3/356113* (2013.01); *H03K 19/018521* (2013.01)

(58) Field of Classification Search
CPC ....... H03K 3/356182; H03K 3/356113; H03K 19/018521; H03K 19/00315; H03K 19/01721; H03K 19/00361; H03K 19/0013; H03K 19/0175; H03K 3/35613; G11C 5/147; G05F 3/262
See application file for complete search history.

(56) References Cited

U.S. PATENT DOCUMENTS

| | | | |
|---|---|---|---|
| 5,821,800 | A | 10/1998 | Le et al. |
| 6,476,637 | B1 | 11/2002 | Brownlow et al. |
| 6,617,878 | B2 | 9/2003 | Brownlow et al. |
| 6,683,486 | B2 | 1/2004 | Hanson et al. |
| 7,053,657 | B1 | 5/2006 | Peng |
| 7,567,112 | B2 | 7/2009 | Shen |
| 7,800,426 | B2 | 9/2010 | Chang |
| 8,358,165 | B2 | 1/2013 | Chou et al. |
| 8,710,897 | B2 | 4/2014 | Kim et al. |
| 9,318,953 | B2 | 4/2016 | Low et al. |
| 2003/0006801 | A1 | 1/2003 | Brownlow et al. |
| 2003/0184358 | A1 | 10/2003 | Hanson et al. |
| 2008/0111609 | A1 | 5/2008 | Shen |

(Continued)

FOREIGN PATENT DOCUMENTS

| | | | |
|---|---|---|---|
| CN | 102820880 | 12/2012 | |
| CN | 112581989 A * | 3/2021 | ............. G11C 5/147 |
| KR | 10-0365037 | 12/2002 | |

*Primary Examiner* — Metasebia T Retebo
*Assistant Examiner* — James G Yeaman
(74) *Attorney, Agent, or Firm* — MORGAN, LEWIS & BOCKIUS LLP

(57) ABSTRACT

A level shifter includes a first circuit that pulls down a first output node and a first intermediate node based on an input signal, and pulls down a second output node and a second intermediate node based on an inverted input signal of the input signal, and a second circuit that pulls up the second output node based on the first intermediate node when the first circuit pulls down the first output node to a supply voltage, and pulls up the first output node based on the second intermediate node to the supply voltage when the first circuit pulls down the second output node.

15 Claims, 19 Drawing Sheets

(56) References Cited

U.S. PATENT DOCUMENTS

2009/0243692 A1 10/2009 Chang
2012/0306537 A1 12/2012 Chou et al.
2012/0313685 A1 12/2012 Kim et al.
2014/0232710 A1* 8/2014 Low .................... H03K 17/693
327/437
2016/0241246 A1* 8/2016 Potluri ........... H03K 19/018521
2023/0198524 A1* 6/2023 Mathur .................. H03K 3/037
327/333

* cited by examiner 9000
910
VDD
T13
T14
T15
T16
VSS
OUT1
OUT
OUT2
ND8
ND9
T12
ND7
T10
T4
T3
T9
ND6
T11
ND1
ND0
V1
V0
T8
T7
V5
V4
ND5
ND4
T6
T5
BIAS_P
BIAS_N
V3
V2
ND3
ND2
T2
T1
INB
IN 1000
VDD
VSS
OUT
VP
VN
1050
1042
1041
1010
1020
1030
1060
T1
T3
T4
T5
T6
T7
T8
T9
T10
T11
T12
T13
T14
T15
T16
T17
J1
J2
PC
M1
M2
M3
M4

Figure 14:
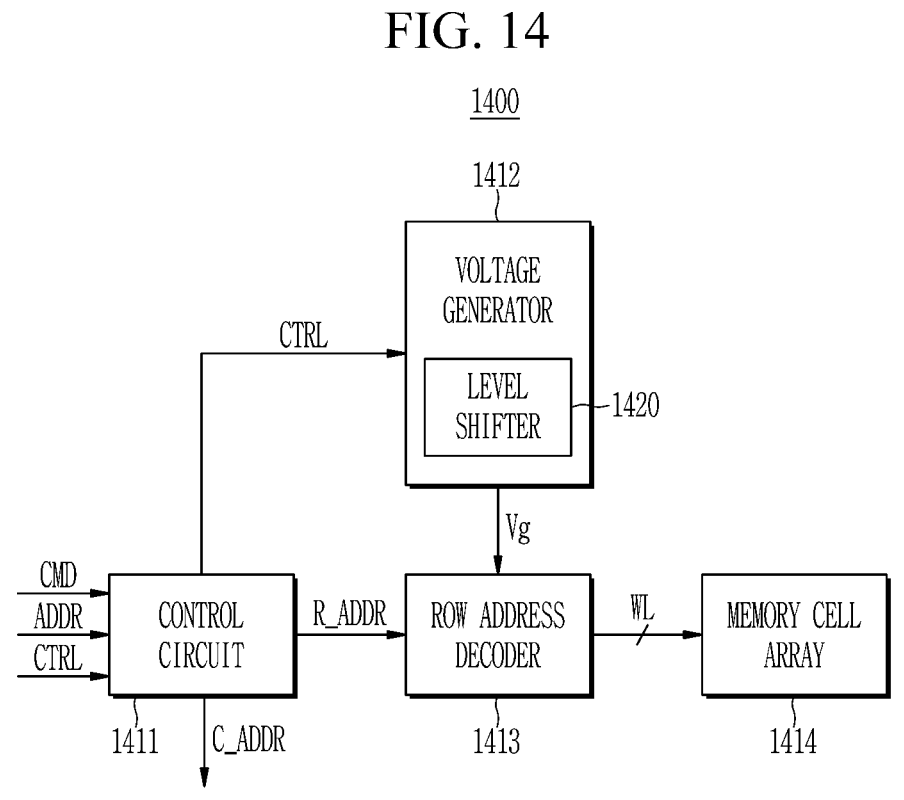

1412
VOLTAGE GENERATOR
LEVEL SHIFTER
1420
CTRL
Vg
CMD
ADDR
CTRL
CONTROL CIRCUIT
R_ADDR
ROW ADDRESS DECODER
WL
MEMORY CELL ARRAY
1411
C_ADDR
1413
1414

WORD-LINE DRIVER

1513

ROW ADDRESS DECODER

LEVEL SHIFTER

1520

LEVEL SHIFTER AND MEMORY DEVICE INCLUDING THE SAME

CROSS-REFERENCE TO RELATED APPLICATION

This patent application claims priority under 35 U.S.C. § 119 to Korean Patent Application No. 10-2023-0164432 filed in the Korean Intellectual Property Office on Nov. 23, 2023, the disclosure of is incorporated by reference herein.

1. Technical Field

The present disclosure is directed to a level shifter for generating an output voltage having a level different from that of an input voltage, based on the input voltage, and a memory device including the same.

2. Discussion of Related Art

An electronic device may include various elements. These elements may operate in the same voltage domain, or may operate in domains different from one another. Elements which belong to the same voltage domain may operate using the same power voltage and the same ground voltage. Elements which belong to voltage domains different from one another may operate using power voltages different from one another and ground voltages different from one another.

An electronic device may include a level shifter to convert a signal belonging to a first voltage domain into a signal belonging to a second other voltage domain.

SUMMARY

The present disclosure may provide a level shifter for receiving an input voltage for generating an output voltage with a level different from that of the input voltage, and a memory device including the same.

Also, the present disclosure may provide a level shifter to alleviate deterioration of transistors and reduce voltage differences between gate terminals and source terminals of the transistors and between the gate terminals and drain terminals based on a bias voltage, and a memory device including the same.

Further, the present disclosure may provide a level shifter with a path different from a path for pulling up the voltage level of an output voltage in response to an input signal, and a memory device including the same.

Furthermore, the present disclosure may provide a level shifter for changing the voltage level of an output voltage by controlling transistors in the level shifter through a path different from a path for pulling up the voltage level of the output voltage in response to an input signal, and a memory device including the same.

A level shifter according to an exemplary embodiment includes a first circuit and a second circuit. The first circuit is configured to pull down a first output node and a first intermediate node based on an input signal, and pull down a second output node and a second intermediate node based on an inverted input signal of the input signal. The second circuit is configured to pull up the second output node to a supply voltage based on the first intermediate node when the first circuit pulls down the first output node, and pull up the first output node to the supply voltage based on the second intermediate node when the first circuit pulls down the second output node.

A level shifter according to an exemplary embodiment includes first through fourth transistors. The first transistor is connected between a first line at a first voltage level and a first node, and includes a gate connected to a second node. The second transistor is connected between the first line and the second node, and includes a gate connected to the first node. The third transistor is connected in parallel with the first transistor between the first line and the first node, and is configured to turn off the second transistor based on an input signal. The fourth transistor is connected in parallel with the second transistor between the first line and the second node, and is configured to turn off the first transistor and the third transistor based on an inverted input signal of the input signal.

A memory device according to an exemplary embodiment includes a row address decoder including a level shifter and a memory cell array. The level shifter is configured to generate an output signal by pulling up a voltage level of a first node to a first voltage level different from the voltage level of the first input signal by a first current flowing through a first path, when receiving a first input signal, shut off the first current by a second current flowing through a second path different from the first path, when receiving a second input signal which is an inverted signal of the first input signal, and pull down the voltage level of the first node to a second voltage level different from the first voltage level by a third current flowing though a third path, when receiving the second input signal and shutting off the first current. The memory cell array includes a first word line configured to receive the output signal, and a plurality of memory cells connected to the first word line.

BRIEF DESCRIPTION OF THE DRAWINGS

FIG. 14 is a schematic block diagram for explaining a memory device in FIG. 13.

FIG. 17 is a schematic block diagram for explaining a level shifter in a row address decoder in FIG. 16.

DETAILED DESCRIPTION

Figure 1:
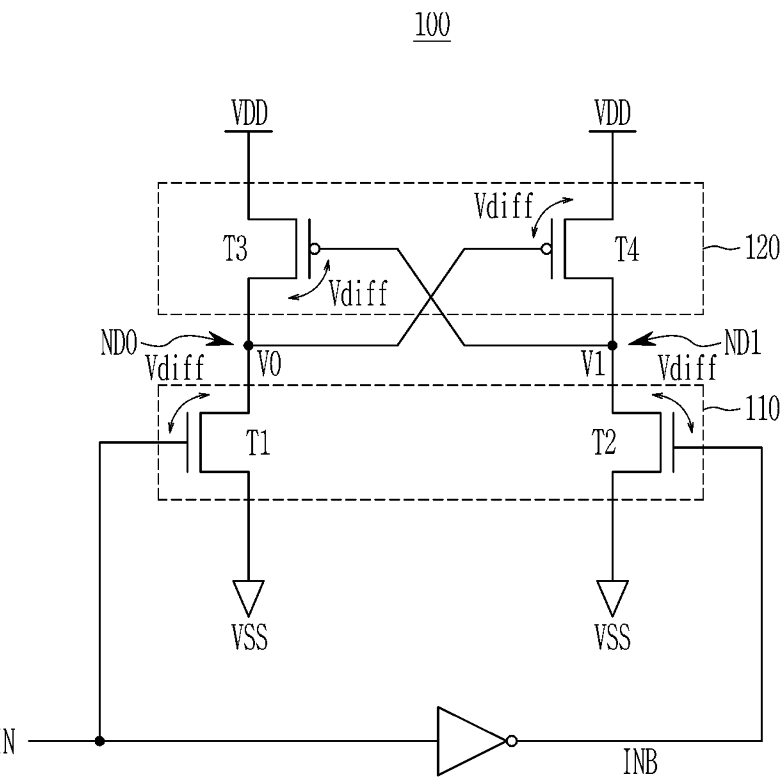
FIG. 1 is a circuit diagram illustrating a level shifter according to a first comparative example.

In the following detailed description, only certain exemplary embodiments of the disclosure have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

Further, expressions written in the singular forms can be comprehended as the singular forms or plural forms unless clear expressions such as “a”, “an”, or “single” are used.

FIG. 1 is a circuit diagram illustrating a level shifter according to a first comparative example.

A level shifter 100 may receive an input signal IN, a supply voltage VDD, and a ground voltage VSS. The level shifter 100 may output the supply voltage VDD and the ground voltage VSS with levels different from that of the input signal IN, based on the input signal IN. The input signal IN may swing between a first voltage level and a second voltage level. Here, the second voltage level may be higher than the first voltage level. The voltage level difference between the voltage level of the supply voltage VDD and the voltage level of the ground voltage VSS may be greater than the voltage level difference between the first voltage level and the second voltage level. Here, the first voltage level and the voltage level of the ground voltage VSS may be substantially the same. In the following description, it is assumed that the voltage level of the supply voltage VDD is higher than the second voltage level and the voltage level of the ground voltage VSS is equal to the first voltage level; however, they are not limited thereto.

The level shifter 100 may include a pull-down circuit 110 and a pull-up circuit 120.

The pull-down circuit 110 may pull down the voltage levels of a first voltage V0 of a first node ND0 and a second voltage V1 of a second node ND1 to the ground voltage VSS in response to the input signal IN and an inverted input signal INB. The pull-down circuit 110 may include transistors T1 and T2. The transistors T1 and T2 may be N-type transistors. The first transistor T1 may be connected between the first node ND0 and a ground voltage (VSS) line. In an embodiment, the source and drain of the first transistor T1 may be connected to the ground voltage (VSS) line and the first node ND0, respectively. The first transistor T1 may receive the input signal IN through its gate. The first transistor T1 may be turned on depending on the voltage level of the input signal IN, thereby discharging the voltage level of the first voltage V0 of the first node ND0 to the ground voltage VSS. The second transistor T2 may be connected between the second node ND1 and the ground voltage (VSS) line. In an embodiment, the source and drain of the second transistor T2 may be connected to the ground voltage (VSS) line and the second node ND1, respectively. The second transistor T2 may receive an inverted input signal INB through its gate. The second transistor T2 may be turned on depending on the voltage level of the inverted input signal INB, thereby discharging the voltage level of the second voltage V1 of the second node ND1 to the ground voltage VSS.

The pull-up circuit 120 may pull up the voltage levels of the first voltage V0 of the first node ND0 and the second voltage V1 of the second node ND1 to the supply voltage VDD in response to the input signal IN and the inverted input signal INB. The pull-up circuit 120 may pull up the voltage level of the second node ND1 to the supply voltage VDD in response to the voltage of the first node ND0 pulled down to the ground voltage VSS by the input signal IN, and may pull up the voltage level of the first node ND0 to the supply voltage VDD in response to the voltage of the second node ND1 pulled down to the ground voltage VSS by the inverted input signal INB.

The pull-up circuit 120 may include transistors T3 and T4. The transistors T3 and T4 may be cross-connected, and may be P-type transistors. The third transistor T3 may be connected between a supply voltage (VDD) line and the first node ND0. The source, drain, and gate of the third transistor T3 may be connected to the supply voltage (VDD) line, the first node ND0, and the second node ND1, respectively. The third transistor T3 may be turned on depending on the voltage level of the second voltage V1 of the second node ND1, thereby pulling up the voltage level of the first voltage V0 of the first node ND0 to the supply voltage VDD. The fourth transistor T4 may be connected between the supply voltage (VDD) line and the second node ND1. The source, drain, and gate of the fourth transistor T4 may be connected to the supply voltage (VDD) line, the first node ND0, and the second node ND1, respectively. The fourth transistor T4 may be turned on depending on the voltage level of the first voltage V0 of the first node ND0, thereby pulling up the voltage level of the second voltage V1 of the second node ND1 to the supply voltage VDD.

However, in the level shifter 100 according to the first comparative example, the supply voltage VDD may cause large voltage differences Vdiff between the gates and drains of the transistors T1, T2, T3, and T4 and between the gates and the sources of the transistors. For example, when the first node ND0 is pulled down to the ground voltage VSS and the second node ND1 is pulled up to the supply voltage VDD, the voltage difference Vdiff between the supply voltage VDD and the ground voltage VSS may be generated between the gate and drain of the third transistor T3 and between the gate and source of the fourth transistor T4. Further, the voltage difference Vdiff between the supply voltage VDD and the ground voltage VSS may be generated between the gate and drain of the second transistor T2. Accordingly, when the supply voltage VDD is applied for a long time, the transistors T1, T2, T3, and T4 may be deteriorated due to hot carrier injection (HCI), time dependent dielectric breakdown (TDDB), and bias temperature instability (BTI) phenomena, etc., which may cause reliability issues for the transistors T1, T2, T3, and T4.

Figure 2:
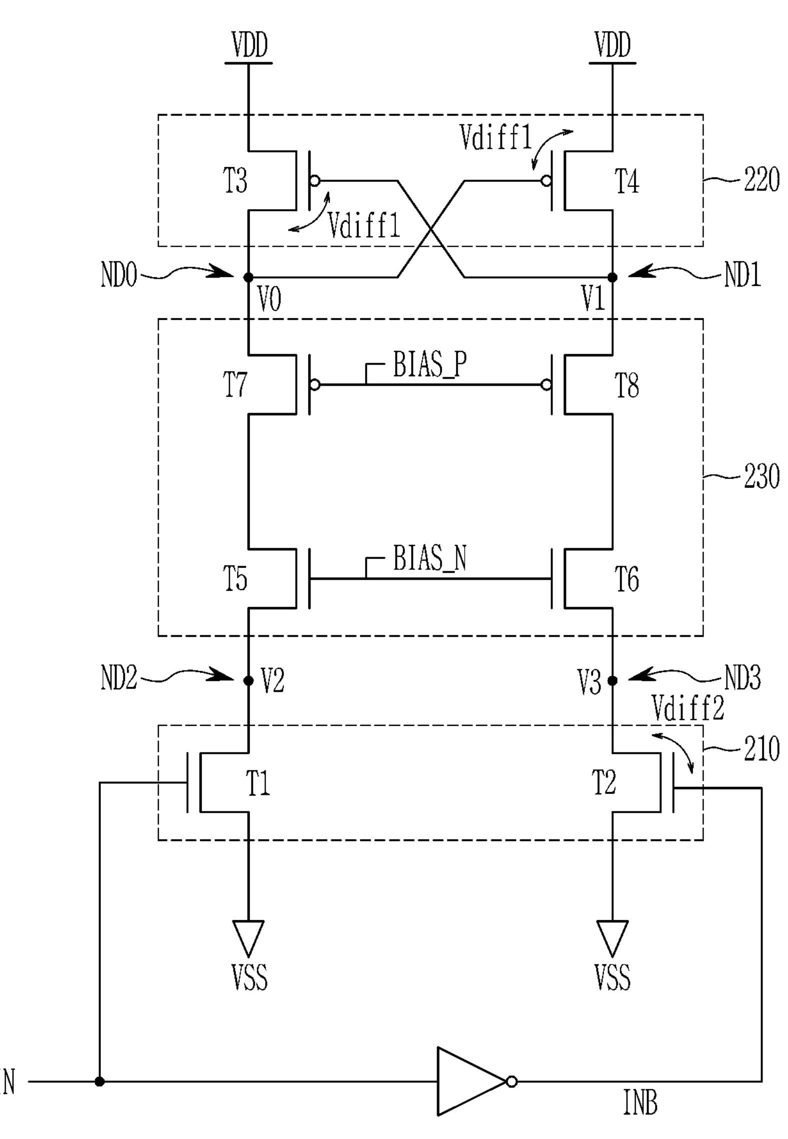
FIG. 2 is a circuit diagram illustrating a level shifter according to a second comparative example.

FIG. 2 is a circuit diagram illustrating a level shifter according to a second comparative example. A level shifter 200 may further include a bias circuit 230, unlike the level shifter 100 in FIG. 1.

The bias circuit 230 may be connected between a pull-down circuit 210 and a pull-up circuit 220. The bias circuit 230 may include transistors T5, T6, T7, and T8. The transistors T5, T6, T7, and T8 may be stacked between the pull-down circuit 210 and the pull-up circuit 220. The transistors T5 and T6 may be N-type transistors, and the transistors T7 and T8 may be P-type transistors.

The transistors T7 and T8 may adjust the lower limits of the voltage levels of the first voltage V0 of the first node ND0 and the second voltage V1 of the second node ND1 to be higher than the voltage level of a first bias signal BIAS_P, based on the first bias signal BIAS_P. The voltage level of the first bias signal BIAS_P may be a minimum voltage level (for example, Vp) for turning on the transistors T7 and T8. Since the lower limits of the voltage levels of the first voltage V0 of the first node ND0 and the second voltage V1 of the second node ND1 are higher than the ground voltage VSS by the transistors T7 and T8, the voltage differences Vdiff1 between the gates and drains of the transistors T3 and T4 connected to the first node ND0 and the second node ND1 and between the gates and sources of them may be smaller than the voltage differences Vdiff in the transistors T3 and T4 in the first comparative example. This may alleviate deterioration of the transistors T3 and T4.

The transistors T5 and T6 may adjust the upper limits of the voltage levels of a third voltage V2 of a third node ND2 and a fourth voltage V3 of a fourth node ND3 to be lower than the voltage level of a second bias signal BIAS_N, based on the second bias signal BIAS_N. The voltage level of the second bias signal BIAS_N may be a minimum voltage level (for example, Vn) for turning on the transistors T5 and T6. Since the upper limits of the voltage levels of the third voltage V2 of the third node ND2 and the fourth voltage V3 of the fourth node ND3 are lower than the supply voltage VDD by the transistors T5 and T6, the voltage differences Vdiff2 between the gates and drains of the transistors T1 and T2 connected to the third node ND2 and the fourth node ND3 and between the gates and sources of them may be smaller than the voltage differences Vdiff in the transistors T1 and T2 in the first comparative example. This may alleviate deterioration of the transistors T1 and T2.

However, for the level shifter 200 to output the supply voltage VDD and the ground voltage VSS with levels different from the input signal IN, the states of the cross-connected transistors T3 and T4 need to be changed based on the input signal IN. For example, the transistors T3 and T4 may be turned on or off based on the voltage levels of the first node ND0 and the second node ND1 such that the level shifter 200 outputs output signals with voltage levels different from the input signal. However, it may not be easy to change the states of the cross-connected transistors T3 and T4 because of the transistors T7 and T8 added to ensure the reliability of the transistors T1, T2, T3, and T4. This will be described with reference to FIGS. 3 and 4 together.

Figure 3:
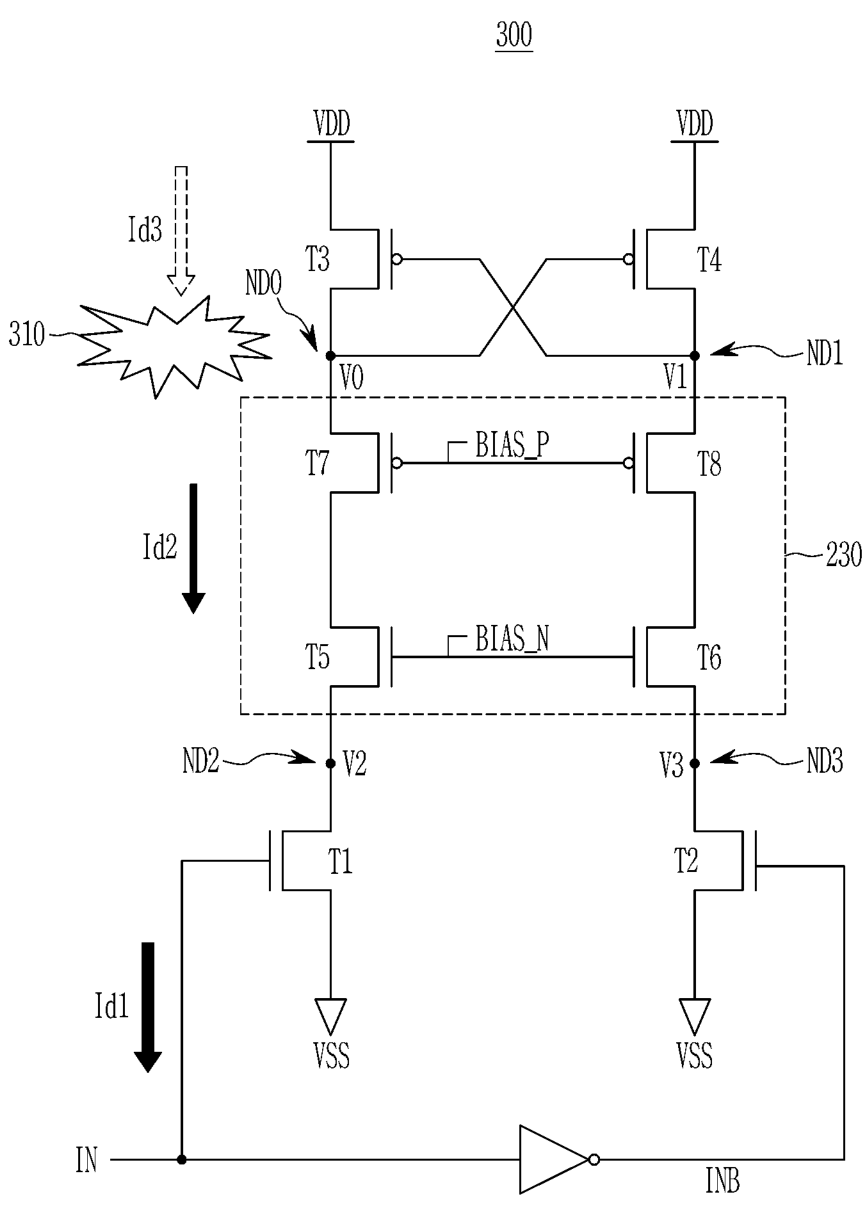
FIG. 3 is a circuit diagram for explaining current fighting of the level shifter according to the second comparative example.
Figure 4:
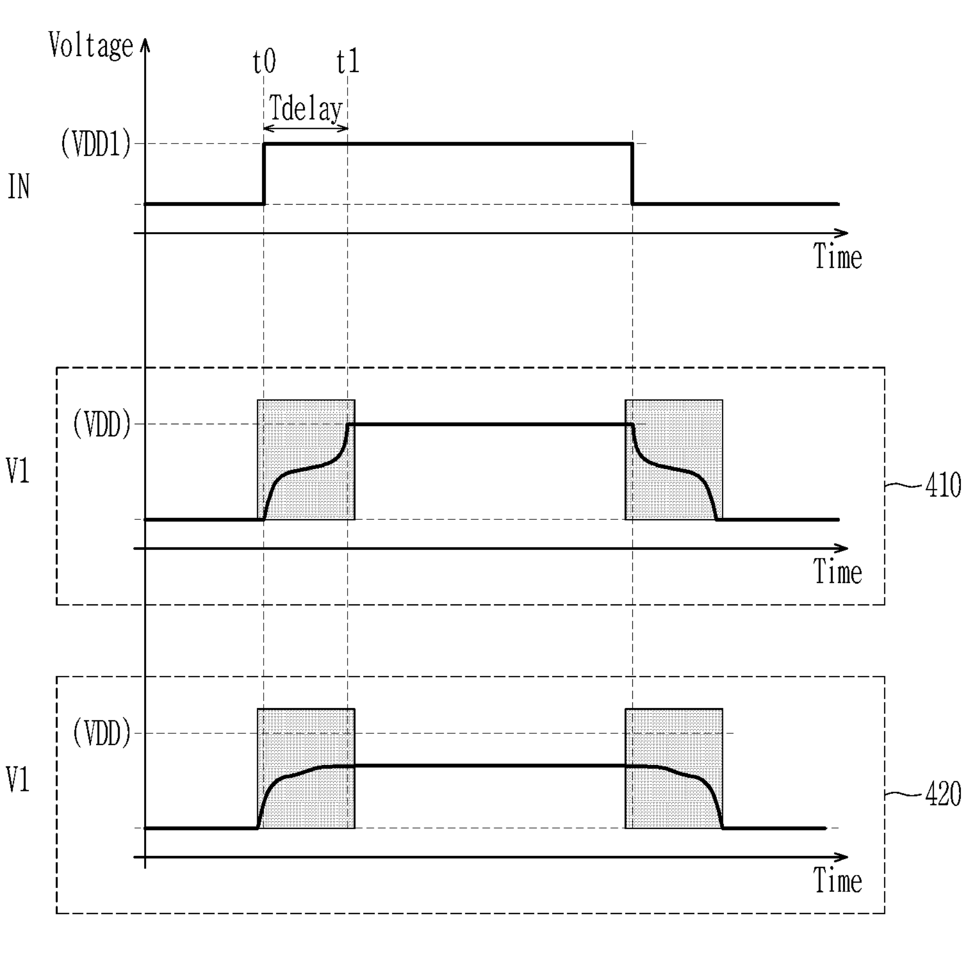
FIG. 4 is a timing chart for explaining the operation of the level shifter in FIG. 3.

FIG. 3 is a circuit diagram for explaining current fighting of the level shifter according to the second comparative example, and FIG. 4 is a timing chart for explaining the operation of the level shifter in FIG. 3.

Referring to FIG. 3, when the input signal IN with the first voltage level (for example, VSS) is input to a level shifter 300, the first transistor T1 may be turned off and the second transistor T2 may be turned on. When the second transistor T2 is turned on, the second voltage V1 (for example, Vp) may be applied to the second node ND1 through the transistors T6 and T8. When the third transistor T3 is turned on by the second voltage V1 of the second node ND1, a driving current Id3 flowing through the third transistor T3 may pull up the voltage level of the first voltage V0 of the first node ND0 to the supply voltage VDD.

Thereafter, when the input signal IN with the second voltage level (for example, VDD1 of FIG. 4) is input to the level shifter 300, to pull up the voltage level of the second voltage V1 of the second node ND1 of the level shifter 300 to the supply voltage VDD, the states of the cross-connected transistors T3 and T4 need to be changed. In an embodiment, when the level shifter 300 receives the input signal IN with the second voltage level VDD1, the first transistor T1 may be turned on and the second transistor T2 may be turned off. When the first transistor T1 is turned on by the input signal IN with the second voltage level VDD1, a driving current Id1 for discharging the third voltage V2 of the third node ND2 to the ground voltage VSS may flow through the first transistor T1. Also, a driving current Id2 weaker than the driving current Id1 may flow by the transistors T5 and T7 stacked on the first transistor T1. When the third voltage V2 of the third node ND2 is discharged to the ground voltage VSS by the driving current Id1 and the first voltage V0 of the first node ND0 is pulled down to a voltage (for example, Vp) sufficient to turn on the fourth transistor T4 by the driving current Id2, the cross-connected fourth transistor T4 may be turned on and the second voltage V1 of the second node ND1 may be pulled up to the supply voltage VDD.

However, the driving current Id3, i.e., the pull-up current, which has been flowing through the third transistor T3 due to the input signal IN with the first voltage level VSS before the input signal IN with the second voltage level VDD1 is input may cause current fighting 310 in relation to the driving current Id2, i.e., the pull-down current, that flows through the seventh transistor T7 after the input signal IN with the second voltage level VDD1 is input. Referring to FIG. 3 and the timing chart 400 of FIG. 4 together, when the input signal IN with the second voltage level VDD1 is input at a first time point t0, current fighting may occur between the driving current Id3 that has been flowing through the third transistor T3 and the driving current Id2 that flows through the seventh transistor T7. When the driving current Id2 flowing through the seventh transistor T7 is larger than the driving current Id3 flowing through the third transistor T3 (i.e., when the driving current Id2 flowing through the seventh transistor T7 is sufficient to pull down the voltage level of the first voltage V0 of the first node ND0), the voltage level of the first voltage V0 of the first node ND0 may be pulled down. When the fourth transistor T4 is turned on as the voltage level of the first voltage V0 is pulled down, the voltage level of the second voltage V1 of the second node ND1 may be pulled up to the supply voltage VDD. However, the current fighting may cause a time delay Tdelay in pulling up the second voltage V1 of the second node ND1 to the supply voltage VDD (see reference symbol "410").

However, when the driving current Id2 flowing through the seventh transistor T7 is smaller than the driving current Id3 that has been flowing through the third transistor T3 (i.e., when the driving current Id2 flowing through the seventh transistor T7 is not sufficient to pull down the first voltage V0 of the first node ND0), the voltage level of the first voltage V0 of the first node ND0 cannot fall sufficiently to turn on the fourth transistor T4. Referring to FIG. 3 and FIG. 4 together, when the driving current Id2 flowing through the seventh transistor T7 is smaller than the driving current Id3 that has been flowing through the third transistor T3, the fourth transistor T4 cannot be turned on, and the voltage level of the second voltage V1 of the second node ND1 cannot be pulled up to the supply voltage VDD (see reference symbol "420").

While the driving current Id2 that flows through the transistors T7 and T8 may reduce reliability issues of the transistors, the driving ability of the driving current Id2 may rapidly decrease below a certain voltage so that the states of the cross-connected transistors T3 and T4 are not changed. Accordingly, an output voltage with a desired level cannot be generated in response to the input signal IN. Therefore, characteristics of the level shifter become degraded.

Figure 5:
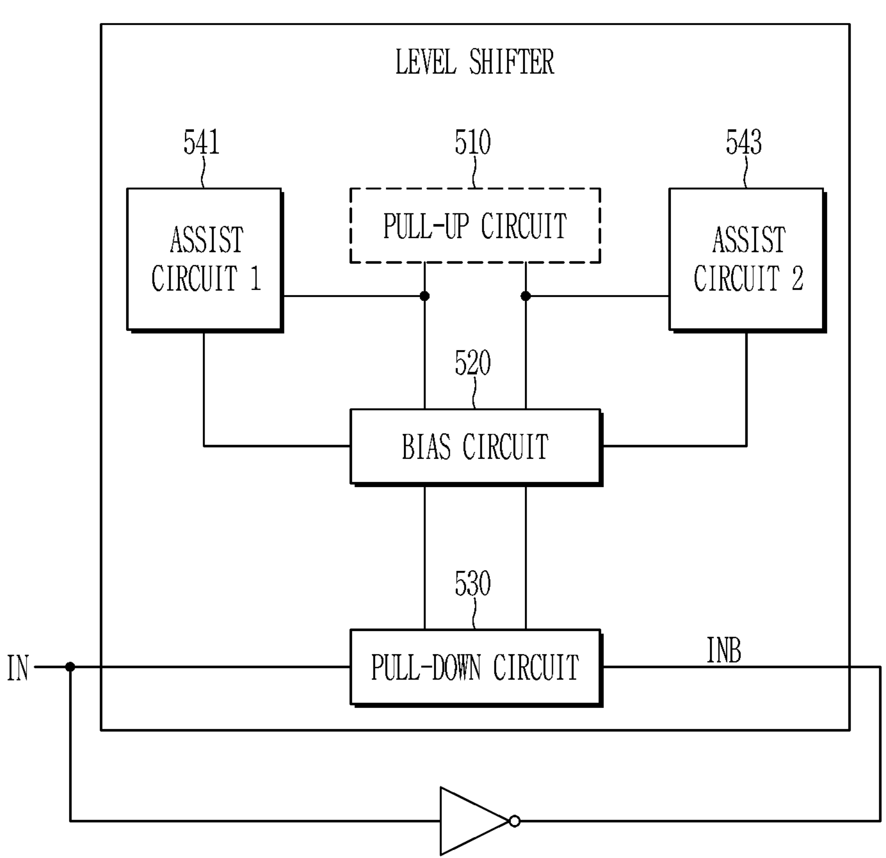
FIG. 5 is a block diagram of a level shifter according to an exemplary embodiment.

FIG. 5 is a block diagram of a level shifter according to an exemplary embodiment.

In an exemplary embodiment, a level shifter 500 may include a pull-up circuit 510, a pull-down circuit 530, a bias circuit 520, and assist circuits 541 and 543. The assist circuits 541 and 543 may be circuits for controlling transistors in the pull-up circuit 510 in paths that are special paths separated for changing the states of the transistors in the pull-up circuit 510 and where there is no current fighting, to ensure the characteristics of the level shifter 500. For example, the assist circuits 541 and 543 may turn off transistors generating a pull-up current in response to the previous input signal IN, among the transistors in the pull-up circuit 510. Due to the transistors being turned off, generation of a pull-up current is prevented. Accordingly, current fighting can be minimized.

In an exemplary embodiment, the level shifter 500 may include the pull-down circuit 530, the bias circuit 520, and the assist circuits 541 and 543. In an exemplary embodiment, the level shifter 500 may not include the pull-up circuit 510. The assist circuits 541 and 543 according to the exemplary embodiment may control the nodes ND0 and ND1 to be subsequently connected to an output circuit, on their respective paths, to ensure the characteristics of the level shifter 500. Detailed configurations of the assist circuits 541 and 543 will be described with reference to FIGS. 6A to 7. The configurations of the pull-up circuit 510, the pull-down circuit 530, and the bias circuit 520 are identical or similar to those in the level shifters according to the comparative examples, and thus a detailed description thereof will not be provided.

Figure 6A:
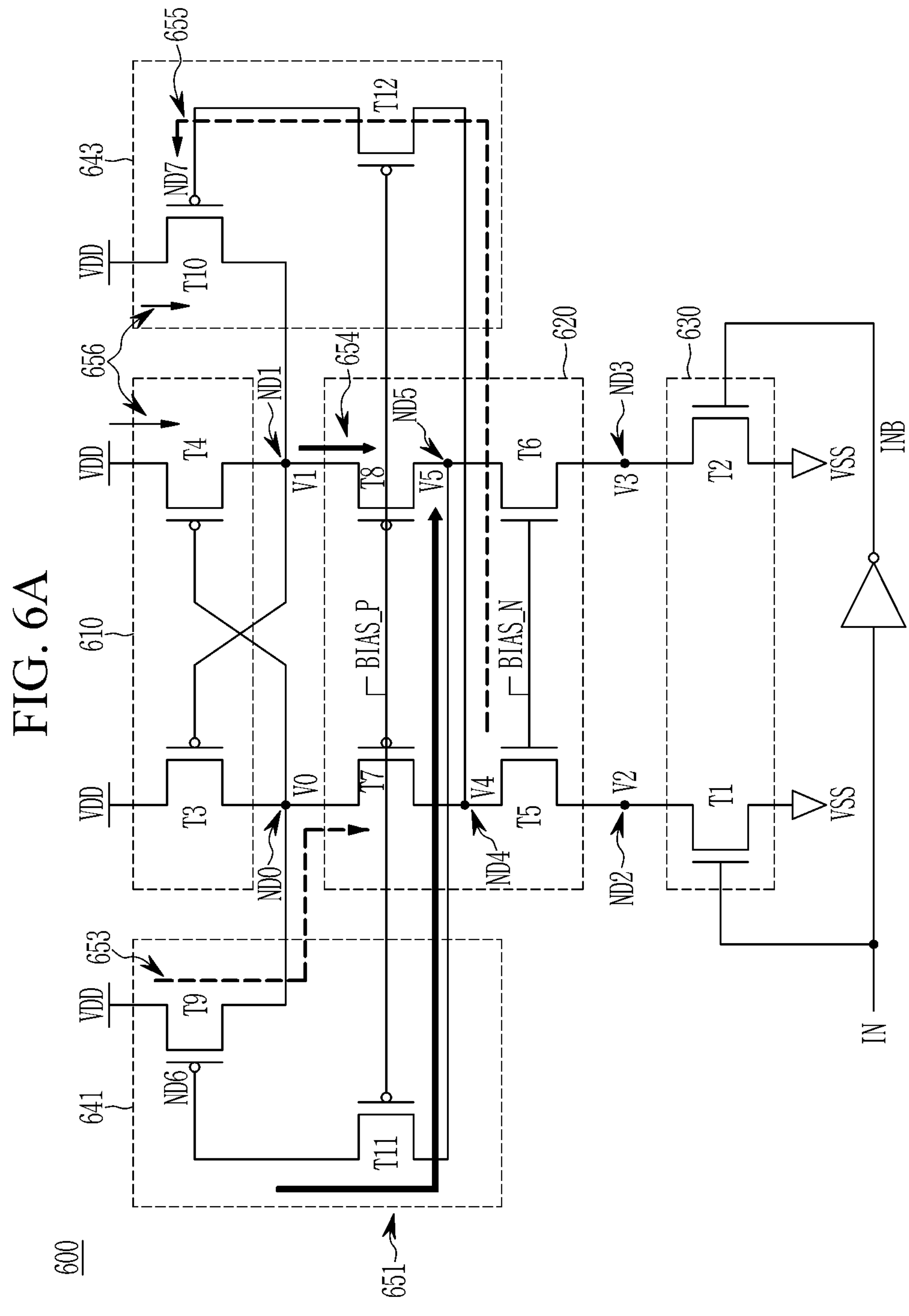
FIG. 6A is a circuit diagram of a level shifter according to an exemplary embodiment.
Figure 6B:
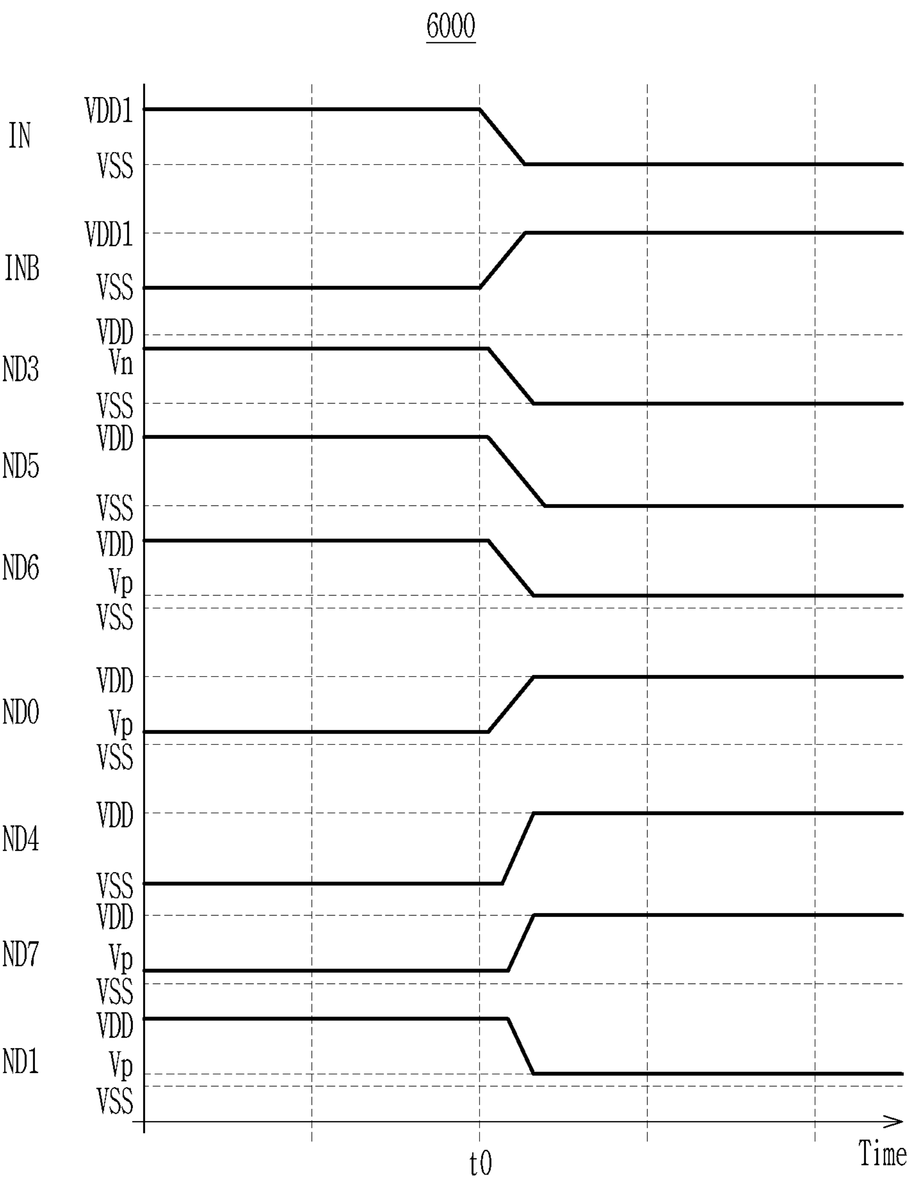
FIG. 6B is a timing chart for explaining the operation of the level shifter according to the exemplary embodiment.

FIG. 6A is a circuit diagram of a level shifter according to an exemplary embodiment, and FIG. 6B is a timing chart for explaining the operation of the level shifter according to the exemplary embodiment.

A level shifter 600 may receive an input signal IN, a supply voltage VDD, and a ground voltage VSS. The level shifter 600 may output the supply voltage VDD and the ground voltage VSS with levels different from that of the input signal IN, based on the input signal IN. In an embodiment, the input signal IN may swing between a first voltage level and a second voltage level, and the second voltage level may be higher than the first voltage level. The voltage level difference between the voltage level of the supply voltage VDD and the voltage level of the ground voltage VSS may be greater than the voltage level difference between the first voltage level and the second voltage level. Here, the first voltage level and the voltage level of the ground voltage VSS may be substantially the same. In the following description, it is assumed that the voltage level of the supply voltage VDD is higher than the second voltage level and the voltage level of the ground voltage VSS is equal to the first voltage level; however, embodiments of the present invention are not limited thereto. Also, in the following description, it is assumed that the level shifter 600 is a level shifter that receives a low-voltage signal and outputs a high-voltage signal; however, embodiments of the present invention are not limited thereto. The level shifter 600 may be a level shifter that receives a high-voltage signal and outputs a low-voltage signal. Alternatively, the level shifter 600 may be a level shifter that outputs the inverted signal of an input signal as an output signal.

In the exemplary embodiment, the level shifter 600 may include a pull-up circuit 610, a bias circuit 620, a pull-down circuit 630, and assist circuits 641 and 643.

In an exemplary embodiment, the first assist circuit 641 may include transistors T9 and T11. The transistors T9 and T11 may be P-type transistors. In the following description, it is assumed that the transistors T9 and T11 are P-type transistors; however, they are not limited thereto.

In an exemplary embodiment, the ninth transistor T9 may be connected between a supply voltage (VDD) line and a first node ND0. In an embodiment, the source and drain of the ninth transistor T9 may be connected to the supply voltage (VDD) line and the first node ND0, respectively. In an exemplary embodiment, the ninth transistor T9 may be connected in parallel with a third transistor T3 of the pull-up circuit 610 between the supply voltage (VDD) line and the first node ND0. In an exemplary embodiment, the ninth transistor T9 may control the first voltage V0 of the first node ND0. The first node ND0 is a node that is connected to the gate of a fourth transistor T4, and may control the state of the fourth transistor T4. The gate of the ninth transistor T9 may be connected to the eleventh transistor T11.

In an exemplary embodiment, the eleventh transistor T11 may be connected between the ninth transistor T9 and a sixth node ND5. In an embodiment, the source and drain of the eleventh transistor T11 may be connected to the gate of the ninth transistor T9 and the sixth node ND5, respectively. The sixth node ND5 may be a node between a sixth transistor T6 and an eighth transistor T8 in the bias circuit 620. In an exemplary embodiment, the eleventh transistor T11 may reduce the voltage differences between the gate and drain of the ninth transistor T9 and between the gate and source of the ninth transistor. The eleventh transistor T11 may alleviate deterioration of the ninth transistor T9.

In an exemplary embodiment, the second assist circuit 643 may include transistors T10 and T12. The transistors T10 and T12 may be P-type transistors. In the following description, it is assumed that the transistors T10 and T12 are P-type transistors; however, they are not limited thereto.

In the exemplary embodiment, the tenth transistor T10 may be connected between the supply voltage (VDD) line and a second node ND1. In an embodiment, the source and drain of the tenth transistor T10 may be connected to the supply voltage (VDD) line and the second node ND1, respectively. In an exemplary embodiment, the tenth transistor T10 may be connected in parallel with the fourth transistor T4 of the pull-up circuit 610 between the supply voltage (VDD) line and the second node ND1. In an exemplary embodiment, the tenth transistor T10 may control the second voltage V1 of the second node ND1. The second node ND1 is a node that is connected to the gate of the third transistor T3, and may control the state of the third transistor T3. The gate of the tenth transistor T10 may be connected to the twelfth transistor T12.

In an exemplary embodiment, the twelfth transistor T12 may be connected between the tenth transistor T10 and a fifth node ND4. In an embodiment, the source and drain of the twelfth transistor T12 may be connected to the gate of the tenth transistor T10 and the fifth node ND4, respectively. The fifth node ND4 may be a node between a fifth transistor T5 and a seventh transistor T7 in the bias circuit 620. In an exemplary embodiment, the twelfth transistor T12 may reduce the voltage differences between the gate and drain of the tenth transistor T10 and between the gate and source of the tenth transistor. The twelfth transistor T12 may alleviate deterioration of the tenth transistor T10.

Hereinafter, a process in which the input signal IN has a second voltage level (for example, VDD1) before a time point t0 and falls to a first voltage level (for example, VSS) at the time point t0 will be described. The operations of the individual transistors in the level shifter 600 will be described with reference to the timing chart of FIG. 6B together. Nodes shown in the timing chart 6000 of FIG. 6B are shown in a certain order for ease of explanation, but the operations are not necessarily performed in the order shown in FIG. 6B.

In the exemplary embodiment, when the input signal with the second voltage level VDD1 is received before the time point t0, the first transistor T1 may be turned on, whereby the voltage level of the third node ND2 may be pulled down to the ground voltage VSS. Accordingly, the fifth transistor T5 may pull down the voltage level of the fifth node ND4 to the ground voltage VSS. Since the seventh transistor T7 and the twelfth transistor T12 are connected to the fifth node ND4, the voltage levels of the first node ND0 and an eighth node ND7 may be pulled down to the gate voltages of the seventh transistor T7 and the twelfth transistor T12 (for example, Vp). According to the voltage levels of the first node ND0 and the eighth node ND7, the fourth transistor T4 and the tenth transistor T10 may be turned on, and thus driving current 656 flowing through the fourth transistor T4 and the tenth transistor T10 may pull up the voltage level of the second node ND1 to the supply voltage VDD.

In an exemplary embodiment, the input signal IN may fall from the second voltage level (for example, VDD1) to the first voltage level (for example, VSS) at the time point t0. As the input signal IN falls, the inverted input signal INB rises. Accordingly, the first transistor T1 may be turned off and the second transistor T2 may be turned on. Referring to FIG. 6A and FIG. 6B together, as the input signal IN falls from the second voltage level VDD1 to the first voltage level VSS, the inverted input signal INB may rise from the first voltage level VSS to the second voltage level VDD1. As the inverted input signal INB rises, the second transistor T2 may pull down the voltage level of the fourth node ND3 to the ground voltage VSS, and the sixth transistor T6 may pull down the voltage level of the sixth node ND5 to the ground voltage VSS.

In an exemplary embodiment, since driving current 651 flows to the sixth node ND5 through the eleventh transistor T11, the voltage level of a seventh node ND6 may be pulled down to the gate voltage Vp of the eleventh transistor T11, and the ninth transistor T9 may be turned on. Referring to FIG. 6A and FIG. 6B together, as the sixth node ND5 is pulled down to the ground voltage (VSS) level, the voltage level of the seventh node ND6 may be pulled down to the voltage level Vp of the first bias signal BIAS_P.

In an exemplary embodiment, when the ninth transistor T9 is turned on as the voltage level of the seventh node ND6 is pulled down, driving current 653 for pulling up the first node ND0 to the supply voltage (VDD) level may flow, and the voltage level of the first node ND0 may be pulled up to the supply voltage (VDD) level. Also, the voltage level of the fifth node ND4 may be pulled up to the supply voltage (VDD) level through the seventh transistor T7. In an exemplary embodiment, when the voltage level of the fifth node ND4 is pulled up to the supply voltage (VDD) level, driving current 655 flowing through the twelfth transistor T12 may pull up the voltage level of the eighth node ND7 to the supply voltage (VDD) level. Referring to FIG. 6A and FIG. 6B together, as the voltage level of the seventh node ND6 is pulled down, the voltage levels of the first node ND0 and the fifth node ND4 may be pulled up to the supply voltage (VDD) level. Also, the voltage level of the eighth node ND7 may be pulled up to the supply voltage (VDD) level.

In an exemplary embodiment, the fourth transistor T4 may be turned off by the voltage level of the first node ND0, and the tenth transistor T10 may be turned off by the voltage level of the eighth node ND7. Accordingly, the driving current 656 that has been flowing to the second node ND1 through the fourth transistor T4 and the tenth transistor T10 may be shut off. In an exemplary embodiment, as the driving current 656 that has been flowing through the fourth transistor T4 and the tenth transistor T10 to pull up the voltage level of the second node ND1 is shut off and the voltage level of the sixth node ND5 is pulled down, driving current 654 for pulling down the voltage level of the second node ND1 may flow through the eighth transistor T8 such that the voltage level of the second node ND1 is pulled down (see reference symbol "ND1" in FIG. 6B). Accordingly, the third transistor T3 may be turned off.

As described above, to change the voltage level of the output signal in response to the voltage level of the input signal, the states of the cross-connected transistors T3 and T4 in the pull-up circuit 610 need to be changed. However, due to current fighting between the pull-up current and the pull-down current, the states of the cross-connected transistors T3 and T4 may not be changed. The level shifter 600 according to an exemplary embodiment may generate the driving currents 653 and 655 for controlling the transistors T4 and T10 through which the existing pull-up current 656 has been flowing, using the driving current 651 flowing through a path different from the path through which the existing pull-up current 656 flows. The level shifter 600 according to an exemplary embodiment shuts off the existing pull-up current 656 by turning off the transistors T4 and T10 based on the driving current 653 and 655, thereby enabling the states of the cross-connected transistors T3 and T4 to be controlled more easily. For example, as the input signal IN falls, to change the state of the third transistor T3, the level shifter 600 according to an exemplary embodiment may control the states of the transistors T4 and T10 through the paths in the assist circuits 641 and 643. As the transistors T4 and T10 are turned off, the voltage level of the second node ND1 is pulled down by the driving current 654 without current fighting. Accordingly, the state of the third transistor T3 may also be changed more easily.

Figure 7:
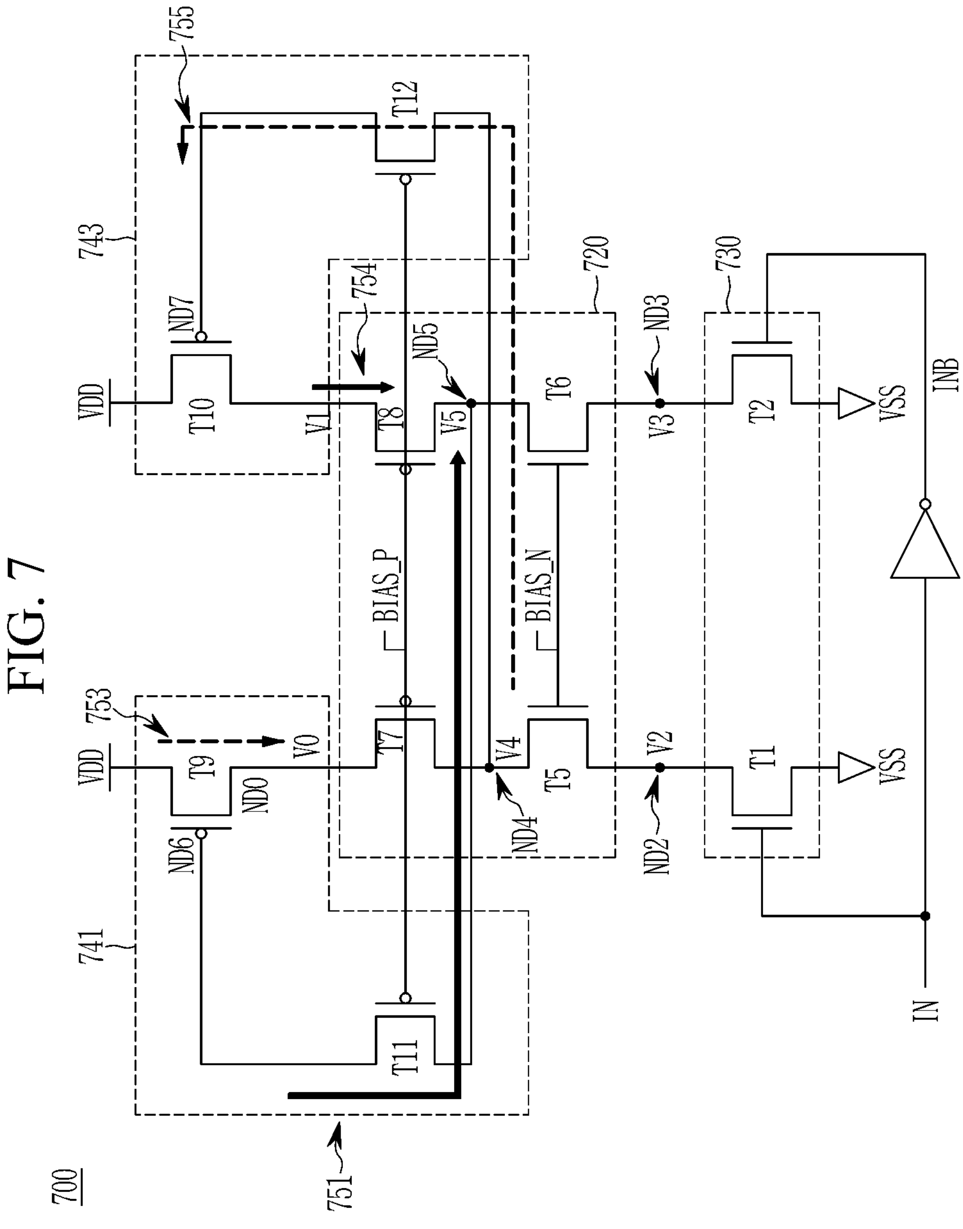
FIG. 7 is a circuit diagram of a level shifter according to an exemplary embodiment.

FIG. 7 is a circuit diagram of a level shifter according to an exemplary embodiment. A level shifter 700 may include a bias circuit 720, a pull-down circuit 730, and assist circuits 741 and 743.

In an operation of the level shifter 700, when the input signal IN with a second voltage level VDD1 is received, the first transistor T1 may be turned on and the voltage level of the third node ND2 may be pulled down to the ground voltage VSS. Accordingly, the fifth transistor T5 may pull down the voltage level of the fifth node ND4 to the ground voltage VSS, and the voltage level of the first node ND0 may be pulled down to the gate voltage (for example, Vp) of the seventh transistor T7. Meanwhile, since the voltage level of the eighth node ND7 is pulled down to the gate voltage (for example, Vp) of the twelfth transistor T12 as the voltage level of the fifth node ND4 is pulled down to the ground voltage VSS, the tenth transistor T10 may be turned on. Accordingly, the voltage level of the second node ND1 may be pulled up to the supply voltage VDD.

In an exemplary embodiment, the input signal IN may fall from the second voltage level VDD1 to the first voltage level VSS. Since the inverted input signal INB rises as the input signal IN falls, the first transistor T1 may be turned off and the second transistor T2 may be turned on. Also, the voltage level of the fourth node ND3 may be pulled down to the ground voltage VSS. Accordingly, the sixth transistor T6 may pull down the voltage level of the sixth node ND5 to the ground voltage VSS. In an exemplary embodiment, since driving current 751 flows to the sixth node ND5 through the eleventh transistor T11, the voltage level of the seventh node ND6 may be pulled down to the gate voltage Vp of the eleventh transistor T11, and the ninth transistor T9 may be turned on. Accordingly, the voltage level of the first node ND0 may be pulled up to the supply voltage (VDD) level, and the voltage level of the fifth node ND4 may also be pulled up to the supply voltage (VDD) level through the seventh transistor T7.

In an exemplary embodiment, when the voltage level of the fifth node ND4 is pulled up to the supply voltage (VDD) level, driving current 755 flowing through the twelfth transistor T12 may pull up the voltage level of the eighth node ND7 to the supply voltage (VDD) level. Accordingly, the tenth transistor T10 may be turned off, and the voltage level of the second node ND1 may be pulled down to the gate voltage Vp of the eighth transistor T8 by driving current 754 flowing through the eighth transistor T8.

The assist circuits 741 and 743 according to an exemplary embodiment may control the voltage levels of the first node ND0 and the second node ND1 to be subsequently connected to an output circuit, on their respective paths. The assist circuits 741 and 743 according to an exemplary embodiment may control the states of the ninth transistor T9 and the tenth transistor T10 on their respective path, to ensure the characteristics of the level shifter 700.

Hereinafter, a level shifter will be described as including a pull-up circuit; however, the level shifter is not limited thereto since the pull-up circuit may be omitted in other embodiments.

Figure 8:
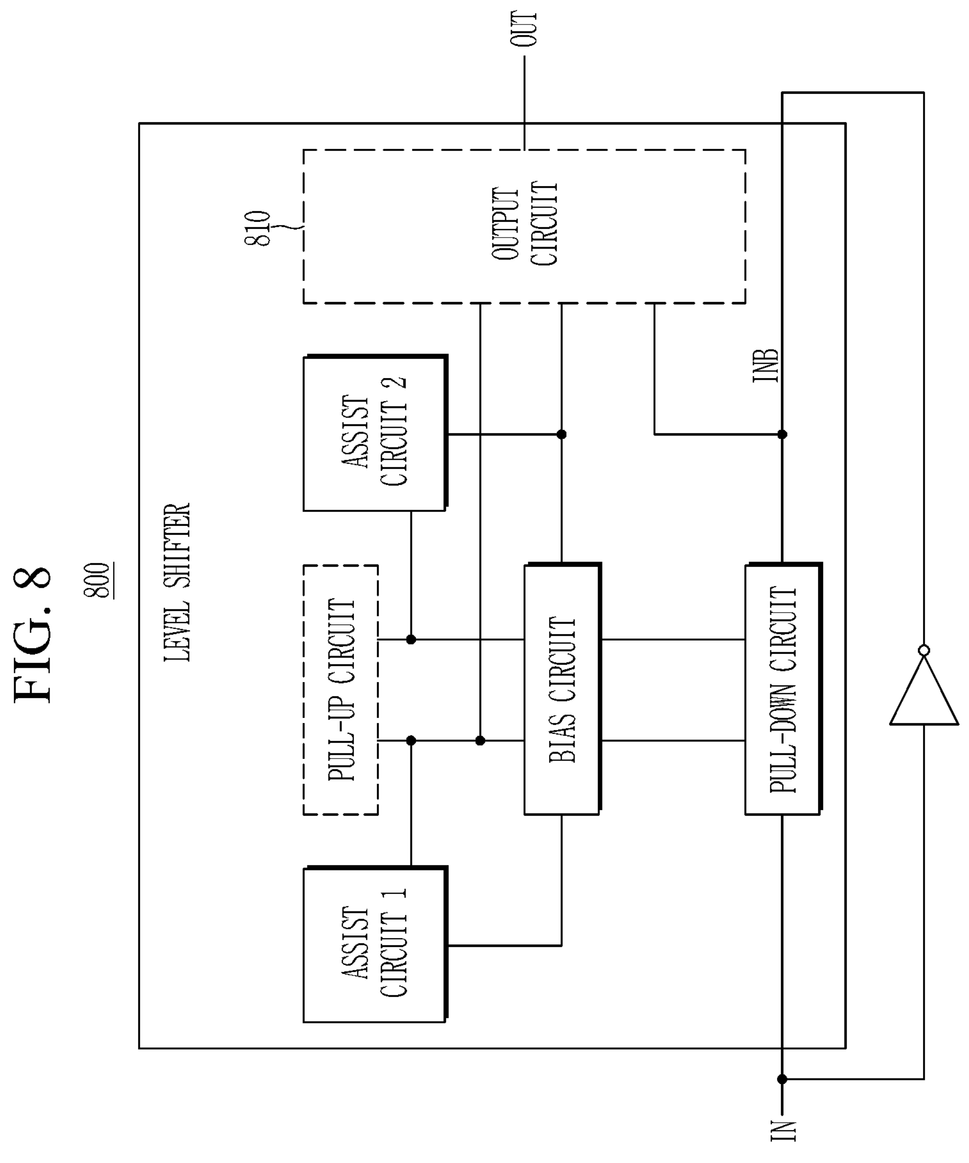
FIG. 8 is a block diagram of a level shifter according to an exemplary embodiment.

FIG. 8 is a block diagram of a level shifter according to an exemplary embodiment. In an embodiment, a level shifter 800 may further include an output circuit 810 for outputting an output signal OUT. The configuration of the output circuit 810 will be described in detail with reference to FIGS. 9A and 9B.

Figure 9A:
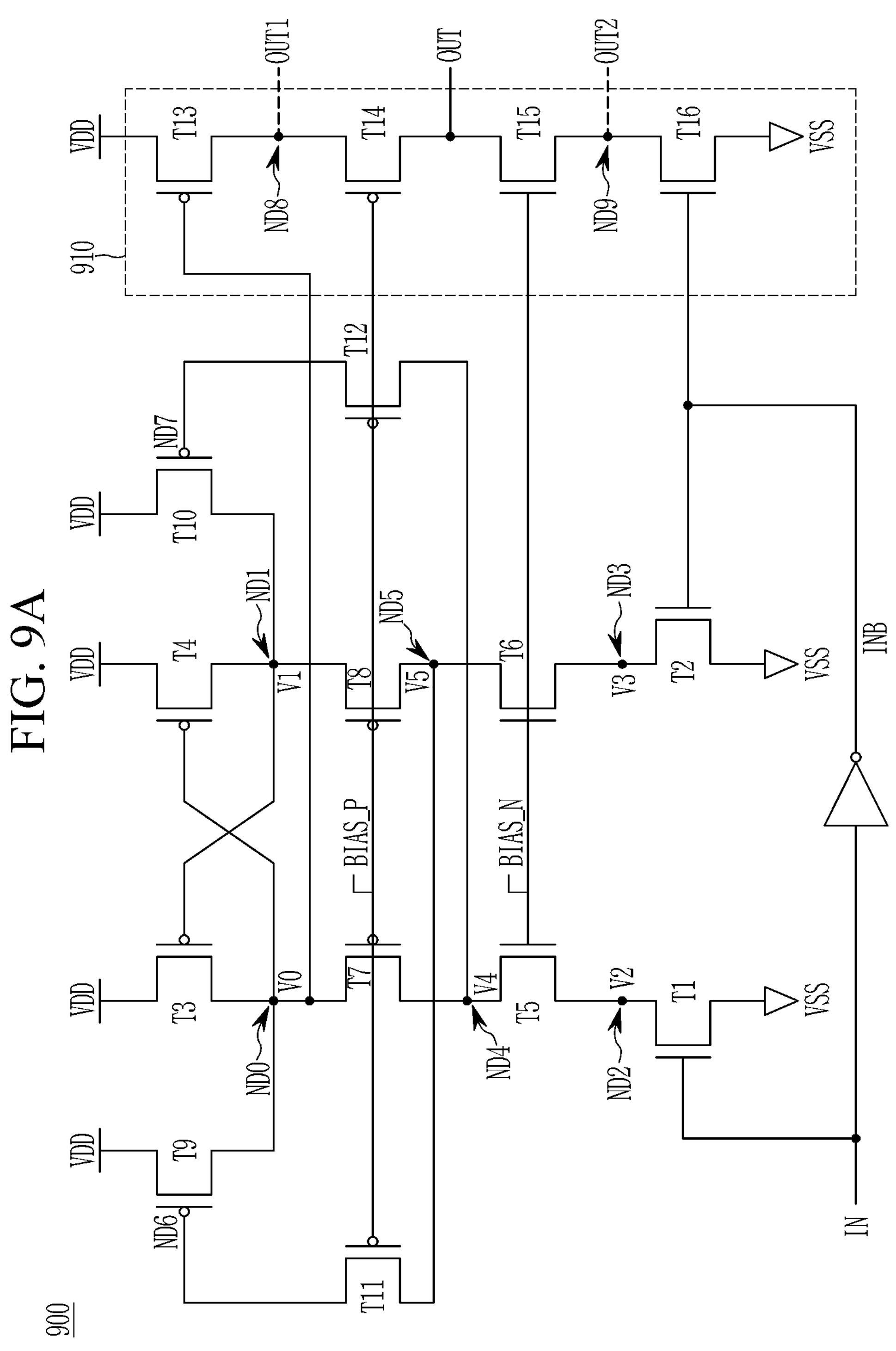
FIG. 9A is a circuit diagram of a level shifter according to an exemplary embodiment.

FIG. 9A is a circuit diagram of a level shifter according to an exemplary embodiment.

A level shifter 900 may receive an input signal IN, a supply voltage VDD, and a ground voltage VSS. The level shifter 900 may output the supply voltage VDD and the ground voltage VSS with levels different from that of the input signal IN, based on the input signal IN.

In an exemplary embodiment, the level shifter 900 may include an output circuit 910 for outputting, as output signals OUT, the supply voltage VDD and the ground voltage VSS with levels different from the input signal IN. In an embodiment, the output signals OUT may swing between the supply voltage (VDD) level and the ground voltage (VSS) level.

In an exemplary embodiment, the output circuit 910 may include transistors T13 and T16. The thirteenth transistor T13 may be a P-type transistor and the sixteenth transistor T16 may be a N-type transistor; however, they are not limited thereto.

In an exemplary embodiment, the thirteenth transistor T13 may be connected between the supply voltage (VDD) line and a ninth node ND8. The source and drain of the thirteenth transistor T13 may be connected to the supply voltage (VDD) line and the ninth node ND8, respectively. In an exemplary embodiment, the gate of the thirteenth transistor T13 may be connected to the first node ND0. In an exemplary embodiment, the thirteenth transistor T13 may be turned on depending on the voltage level of the first voltage V0 of the first node ND0, and pulls up the voltage level of the ninth node ND8 to the supply voltage (VDD) level.

In an exemplary embodiment, the sixteenth transistor T16 may be connected between the ground voltage (VSS) line and a tenth node ND9. The source and drain of the sixteenth transistor T16 may be connected to the ground voltage (VSS) line and the tenth node ND9, respectively. In an exemplary embodiment, the gate of the sixteenth transistor T16 may be connected to a node receiving the inverted input signal INB. In an exemplary embodiment, the sixteenth transistor T16 may be turned on depending on the inverted input signal INB, and pulls down the voltage level of the tenth node ND9 to the ground voltage (VSS) level. The level shifter 900 may include an inverter to invert the input signal IN to generate the inverted input signal INB.

In an exemplary embodiment, the output circuit 910 may further include transistors T14 and T15. In an exemplary embodiment, the fourteenth transistor T14 may be connected between the ninth node ND8 and an output signal (OUT) line. The source and drain of the fourteenth transistor T14 may be connected to the ninth node ND8 and the output signal (OUT) line, respectively. The gate of the fourteenth transistor T14 may be connected to a node receiving the first bias signal BIAS_P. In an exemplary embodiment, the fourteenth transistor T14 may output the voltage level of the ninth node ND8 as an output signal OUT based on the first bias signal BIAS_P.

In an exemplary embodiment, the fifteenth transistor T15 may be connected between the tenth node ND9 and the output signal (OUT) line. The source and drain of the fifteenth transistor T15 may be connected to the tenth node ND9 and the output signal (OUT) line, respectively. The gate of the fifteenth transistor T15 may be connected to the second bias signal BIAS_N. In an exemplary embodiment, the fifteenth transistor T15 may output the voltage level of the tenth node ND9 as an output signal OUT based on the second bias signal BIAS_N. In an exemplary embodiment, the fourteenth transistor T14 may be a P-type transistor and the fifteenth transistor T15 may be a N-type transistor; however, they are not limited thereto.

In an exemplary embodiment, the fourteenth transistor T14 may adjust a lower limit of a voltage level of the ninth node ND8 to be higher than the voltage level (for example, Vp) of the first bias signal BIAS_P, based on the first bias signal BIAS_P. The fourteenth transistor T14 may reduce the voltage differences between the gate and drain of the thirteenth transistor T13 and between the gate and source of the thirteenth transistor. This may alleviate deterioration of the thirteenth transistor T13.

In an exemplary embodiment, the fifteenth transistor T15 may adjust the upper limit of the voltage level of the tenth node ND9 to be lower than the voltage level (for example, Vn) of the second bias signal BIAS_N, based on the second bias signal BIAS_N. The fifteenth transistor T15 may reduce the voltage differences between the gate and drain of the sixteenth transistor T16 and between the gate and source of the sixteenth transistor. This may alleviate deterioration of the sixteenth transistor T16.

In an exemplary embodiment, the output circuit 910 of the level shifter 900 may further output a first output signal OUT1 and/or a second output signal OUT2. In an exemplary embodiment, the first output signal OUT1 may be the voltage level of the ninth node ND8, and the second output signal OUT2 may be the voltage level of the tenth node ND9. In an exemplary embodiment, the first output signal OUT1 may swing between the voltage level Vp of the first bias signal BIAS_P and the supply voltage (VDD) level. In an exemplary embodiment, the second output signal OUT2 may swing between the voltage level Vn of the second bias signal BIAS_N and the ground voltage (VSS) level.

Figure 9B:
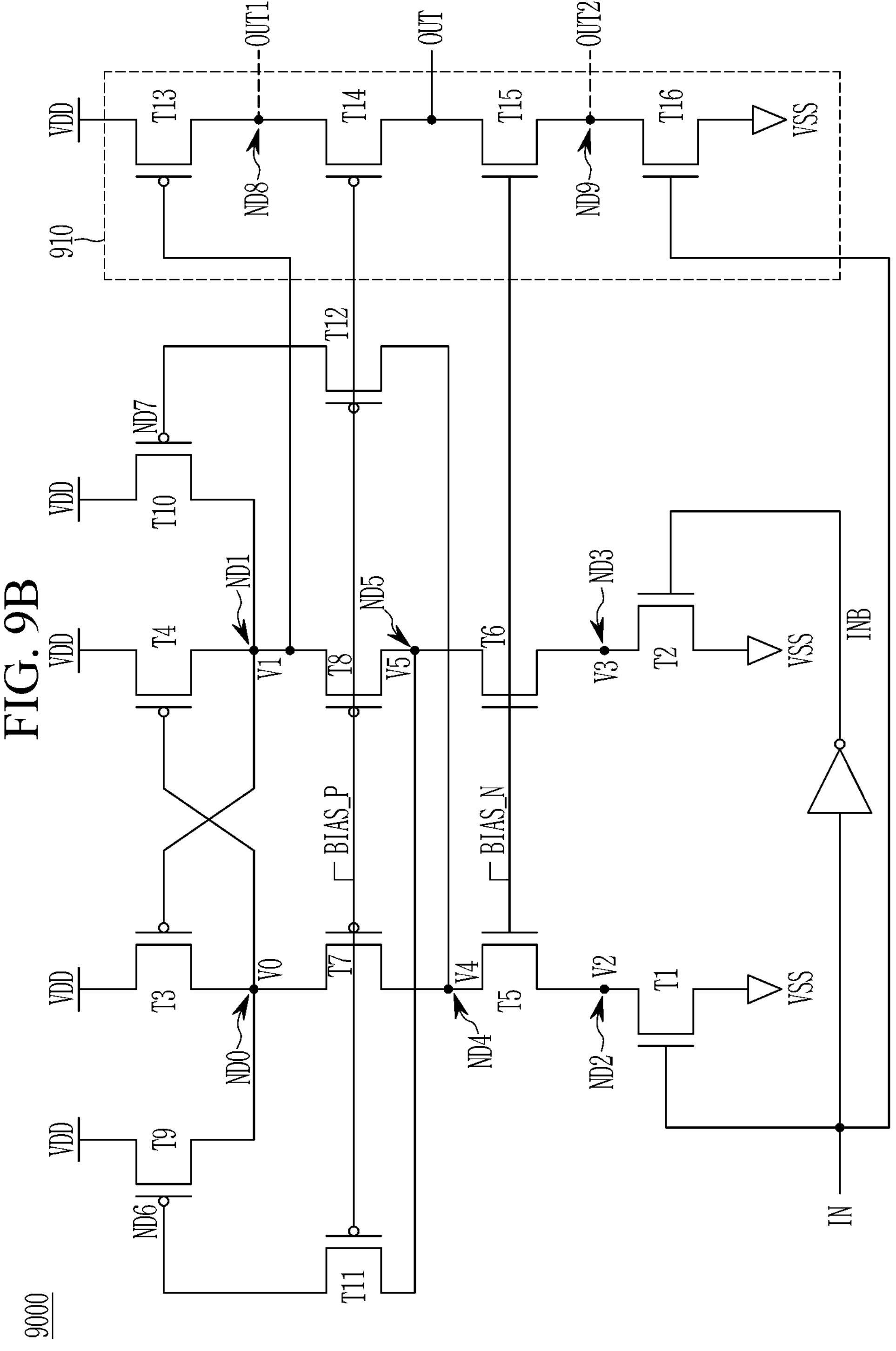
FIG. 9B is a circuit diagram of a level shifter according to an exemplary embodiment.

FIG. 9B is a circuit diagram of a level shifter according to an exemplary embodiment. A level shifter 9000 according to an exemplary embodiment may output the supply voltage VDD and the ground voltage VSS with levels different from that an input signal IN, based on the input signal IN. Since components in an output circuit 910 in FIG. 9B are identical to or similar to those in the output circuit 910 in FIG. 9A, a description thereof will not be provided here.

In an exemplary embodiment, the gate of the thirteenth transistor T13 of the output circuit 910 is connected to the second node ND1. In an exemplary embodiment, the thirteenth transistor T13 may be turned on depending on the voltage level of the second voltage V1 of the second node ND1, and pulls up the voltage level of the ninth node ND8 to the supply voltage (VDD) level.

In an exemplary embodiment, the gate of the sixteenth transistor T16 in the output circuit 910 may be connected to a node receiving the input signal IN. In an exemplary embodiment, the sixteenth transistor T16 may be turned on depending on the input signal IN, and pulls down the voltage level of the tenth node ND9 to the ground voltage VSS.

The level shifter 9000 according to the exemplary embodiment may output the inverted signal of the input signal IN as an output signal OUT based on the input signal IN. In an embodiment, the output signal OUT may swing between the supply voltage (VDD) level and the ground voltage (VSS) level.

The level shifter 9000 according to an exemplary embodiment may further output a first output signal OUT1 and a second output signal OUT2. The first output signal OUT1 and the second output signal OUT2 may be the inverted signal of the input signal IN. In an embodiment, the first output signal OUT1 may swing between the voltage level Vp of the first bias signal BIAS_P and the supply voltage (VDD) level, and the second output signal OUT2 may swing between the voltage level Vn of the second bias signal BIAS_N and the ground voltage (VSS) level.

Figure 10:
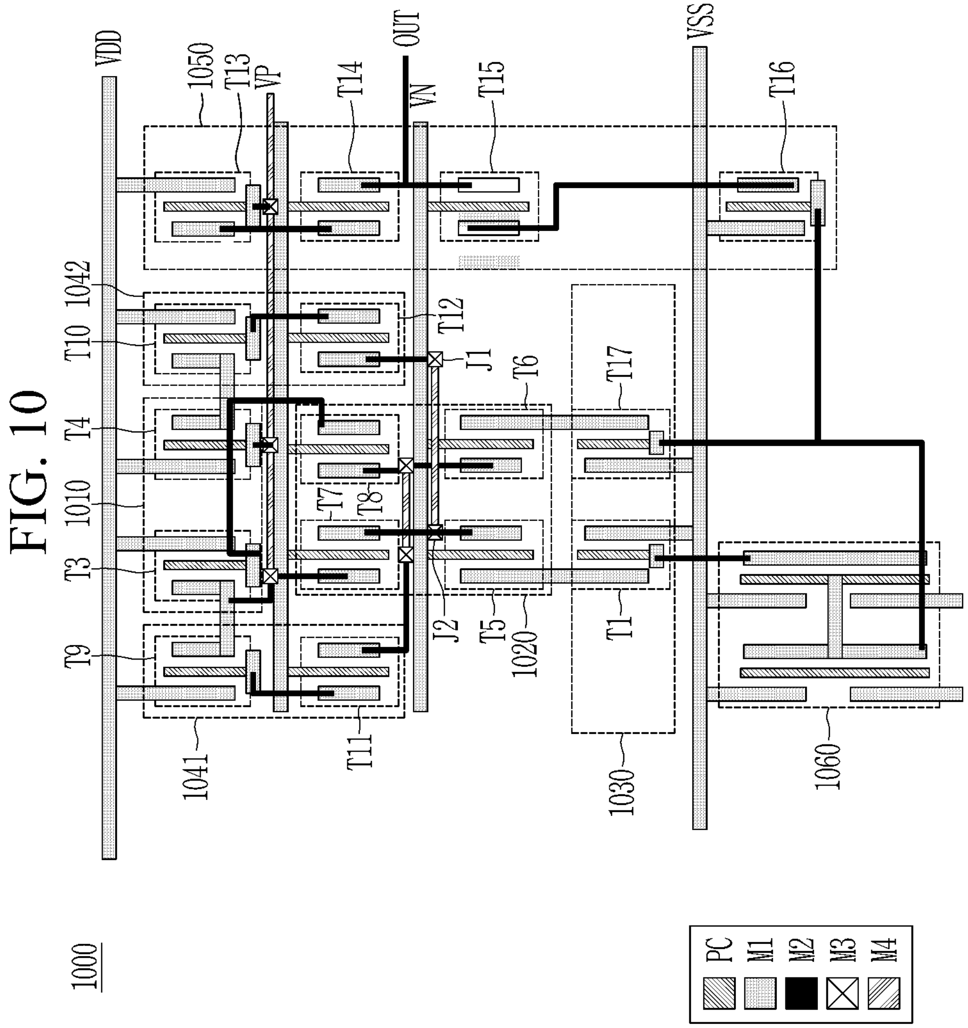
FIG. 10 is a layout diagram of a level shifter according to an exemplary embodiment.

FIG. 10 is a layout diagram of a level shifter according to an exemplary embodiment.

In an exemplary embodiment, a level shifter 1000 may include a pull-up circuit 1010, a bias circuit 1020, a pull-down circuit 1030, assist circuits 1041 and 1042, and an output circuit 1050. The level shifter 1000 may receive an input signal and an inverted input signal from an input circuit 1060, and may output an output signal OUT through the output circuit 1050.

In an exemplary embodiment, the level shifter 1000 may include a supply voltage (VDD) line, a first bias voltage (VP) line, a second bias voltage (VN) line, and a ground voltage (VSS) line of first metal layers M1 extending in a first direction. The supply voltage (VDD) line, the first bias voltage (VP) line, the second bias voltage (VN) line, and the ground voltage (VSS) line may be spaced apart from one another in a second direction perpendicular to the first direction. Individual transistors T1 to T16 in the level shifter 1000 may include gate terminals and source/drain terminals. The gate terminals are shown as poly contact (PC) layers and the source/drain terminals are shown as first metal layers M1; however, they are not limited thereto.

In an exemplary embodiment, the transistors T11 and T12 in the assist circuits 1041 and 1042 are connected to junction points J1 and J2 in the bias circuit 1020, and the transistors T9 and T10 connected to the transistors T11 and T12 may control the transistors T3 and T4 in the pull-up circuit 1010. For example, a first terminal of the eleventh transistor T11 may be connected to a first terminal of the eighth transistor T8 and a first terminal of the sixth transistor T6 through a second metal layer M2, a third metal layer M3, and a fourth metal layer M4. The gate terminal of the eleventh transistor T11 may be connected to the first bias voltage (VP) line, and a second terminal of the eleventh transistor T11 may be connected to the gate terminal of the ninth transistor T9 through a first metal layer M1 and a second metal layer M2. The first terminal of the ninth transistor T9 may be connected to the gate terminal of the fourth transistor T4 through a second metal layer M2, a third metal layer M3, and a fourth metal layer M4. In an embodiment, as the voltage level of the first junction point J1 is discharged, the eleventh transistor T11 may pull down the voltage level of the gate terminal of the ninth transistor T9, thereby turning on the ninth transistor T9. When the ninth transistor T9 is turned on, the voltage level of the gate terminal of the fourth transistor T4 is pulled up to the supply voltage (VDD) level through the first terminal of the ninth transistor T9, whereby the fourth transistor T4 may be turned off.

The level shifter 1000 according to an exemplary embodiment may use the junction points J1 and J2 in the bias circuit 1020 as current paths for changing the states of the transistors T3 and T4 in the pull-up circuit 1010. This may minimize the area occupied by the assist circuits 1041 and 1042 in the level shifter 1000.

As described above, the individual transistors T1 to T16 may be connected to one another through the first metal layers M1 to the fourth metal layers M4; however, they are not limited thereto, and may be connected to one another through more or fewer metal layers. Also, although not shown in the drawing, the individual metal layers may be connected through metal vias.

Figure 11:
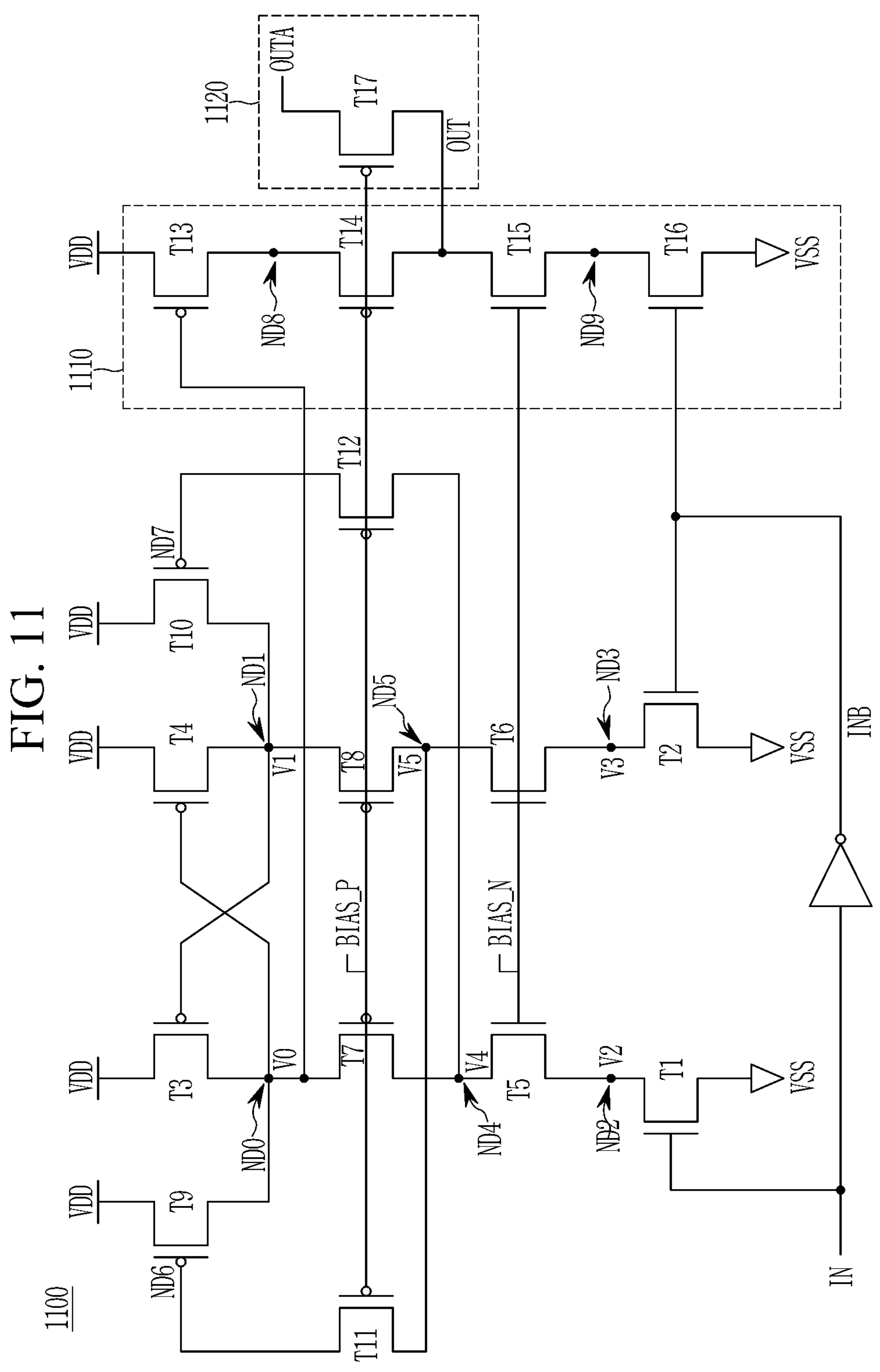
FIG. 11 is a circuit diagram of a level shifter according to an exemplary embodiment.

FIG. 11 is a circuit diagram of a level shifter according to an exemplary embodiment. A level shifter 1100 according to an exemplary embodiment may further include a first voltage level control circuit 1120 connected to an output circuit 1110.

In an exemplary embodiment, the first voltage level control circuit 1120 may include a seventeenth transistor T17. The seventeenth transistor T17 may be connected to a line through which an output signal OUT is output by the output circuit 1110. In an exemplary embodiment, the seventeenth transistor T17 may change the voltage level of the output signal OUT to be output by the output circuit 1110. The seventeenth transistor T17 may be a P-type transistor.

In an exemplary embodiment, the seventeenth transistor T17 may adjust a lower limit of the voltage level of the output signal OUT to be higher than the voltage level of the first bias signal BIAS_P, based on the first bias signal BIAS_P to generate an adjusted signal, and outputs the adjusted signal as a first output signal OUTA. In an embodiment, the voltage level of the first bias signal BIAS_P may be a minimum level (for example, Vp) for turning on the seventeenth transistor T17. Accordingly, the first output signal OUTA that is output through the seventeenth transistor T17 may be a value that swings between the voltage level Vp of the first bias signal and the supply voltage (VDD) level.

Figure 12:
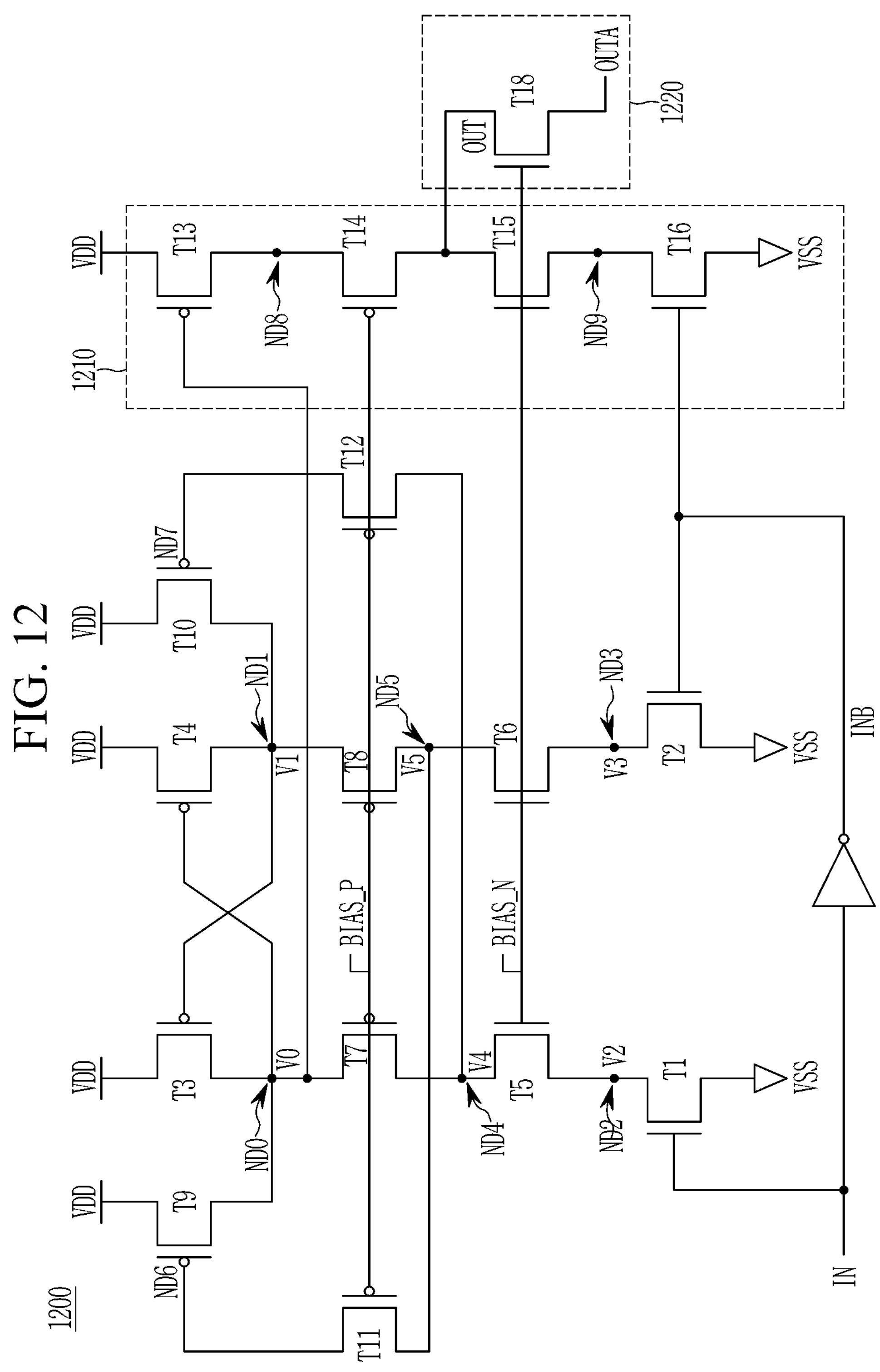
FIG. 12 is a circuit diagram of a level shifter according to an exemplary embodiment.

FIG. 12 is a circuit diagram of a level shifter according to an exemplary embodiment. A level shifter 1200 according to an exemplary embodiment may further include a second voltage level control circuit 1220 connected to an output circuit 1210.

In an exemplary embodiment, the second voltage level control circuit 1220 may include an eighteenth transistor T18. The eighteenth transistor T18 may be connected to a line through which an output signal OUT is output by the output circuit 1210. In an exemplary embodiment, the eighteenth transistor T18 changes the voltage level of the output signal OUT to be output by the output circuit 1210. The eighteenth transistor T18 may be a N-type transistor.

In an exemplary embodiment, the eighteenth transistor T18 may adjust an upper limit of the voltage level of the output signal OUT to be lower than the voltage level of the second bias signal BIAS_N, based on the second bias signal BIAS_N to generate an adjusted signal, and outputs the adjusted signal as a second output signal OUTA. In an embodiment, the voltage level of the second bias signal BIAS_N is a minimum level (for example, Vn) for turning on the eighteenth transistor T18. Accordingly, the second output signal OUTA that is output through the eighteenth transistor T18 may be a value that swings between the voltage level Vn of the second bias signal and the ground voltage (VSS) level.

The level shifter 1200 according to an exemplary embodiment may adjust the voltage level of the output signal OUT to be output, in response to the input signal IN, by including both or one of the first voltage level control circuit in FIG. 11 (see reference symbol "1120" in FIG. 11) and the second voltage level control circuit 1220.

Figure 13:
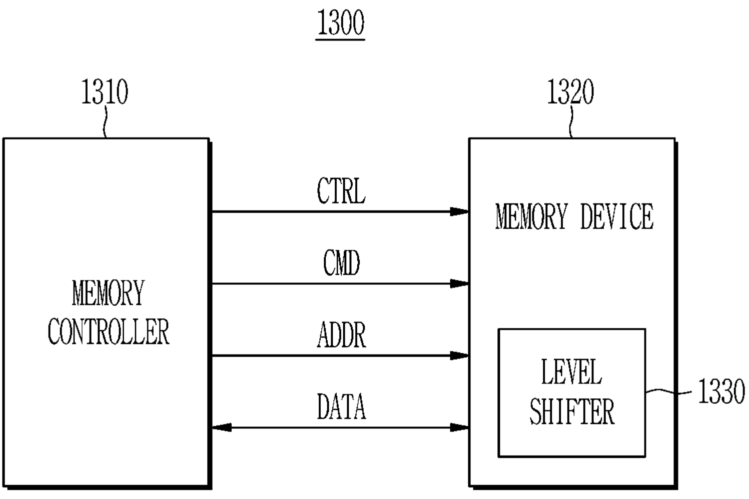
FIG. 13 is a block diagram illustrating a memory system according to an exemplary embodiment.

FIG. 13 is a block diagram illustrating a memory system according to an exemplary embodiment. Referring to FIG. 13, a memory system 1300 may include a memory controller 1310 (e.g., a controller circuit) and a memory device 1320. The memory device 1320 may include a level shifter 1330 according to an exemplary embodiment.

In an exemplary embodiment, the memory system 1300 may be mounted in the form of a system-on-chip (SOC) in an electronic device such as a computer, a laptop, a cellular phone, a smart phone, an MP3 player, a personal digital assistant (PDA), a portable multimedia player (PMP), a digital TV, a digital camera, a portable game console, a modem, or the like.

The memory controller 1310 may read data DATA from the memory device 1320 and write data DATA to the memory device 1320 in response to read/write requests of an external host HOST. The memory controller 1310 may output control signals CTRL, commands CMD, addresses ADDR, and data DATA to the memory device 1320, and receive data DATA from the memory device for responding to the read/write requests.

The memory device 1320 is a device for storing data and may include volatile memories such as dynamic random access memories (DRAMs), static RAMs (SRAMs), synchronous DRAMs (SDRAMs), and the like, or non-volatile memories such as read only memories (ROMs), programmable ROMs (PROMs), electrically programmable ROM (EPROMs), electrically erasable and programmable ROM (EEPROMs), flash memories, phase-change RAMs (PRAMs), magnetic RAMs (MRAMs), resistive RAMs (RRAMs), ferroelectric RAMs (FRAMs), and the like.

The memory device 1320 may include the level shifter 1330 according to an exemplary embodiment of the present invention. The memory device 1320 may generate an output signal having a voltage higher or lower than a voltage applied from the outside through the level shifter 1330. The level shifter 1330 may be implemented by any of the previously described level shifters. The operating methods of the memory device 1320 and the level shifter 1330 in the memory device 1320 will be described below with reference to FIGS. 14 to 17.

FIG. 14 is a schematic block diagram for explaining the memory device in FIG. 13.

A memory device 1400 may include a memory cell array 1414, a voltage generator 1412, a row address decoder 1413, and a control circuit 1411. However, the memory device 1400 may further include other constituent elements such as page buffers. The memory device 1320 of FIG. 13 may be implemented by the memory device 1400.

The control circuit 1411 may provide individual control signals related to memory operations to the voltage generator 1412 and the row address decoder 1413. The control circuit 1411 may control the overall operation of the memory device 1400. The control circuit 1411 may control the memory device 1400, using internal control signals based on at least one of addresses ADDR, commands CMD, and control signals CTRL received from a memory controller (see reference symbol "1310" in FIG. 13). For example, the control circuit 1411 may generate a control signal CTRL for controlling the voltage generator 1412, or generate a row address R_ADDR and a column address C_ADDR based on an address ADDR. The control circuit 1411 may output the row address R_ADDR to the row address decoder 1413.

The voltage generator 1412 may generate various voltages for performing programming operations and read operations on the memory cell array 1414. The voltage generator 1412 may generate various kinds of word line voltages to be supplied to word lines WL in the memory cell array 1414, based on the control signals CTRL of the control circuit 1411. The voltage generator 1412 may include a level shifter 1420 according to an exemplary embodiment. The level shifter 1420 may be implemented by any of the previously described level shifters. The operating method of the level shifter 1420 will be described in detail with reference to FIG. 15.

The row address decoder 1413 may be connected to the memory cell array 1414 through the word lines WL. The row address decoder 1413 may select a word line WL by decoding a row address R_ADDR. The row address decoder 1413 may provide a voltage signal Vg supplied from the voltage generator 1412, to the word lines WL. The row address decoder 1413 may receive a read voltage or a programming voltage from the voltage generator 1412, and provide them to a selected word line WL connected to a plurality of memory cells.

Figure 15:
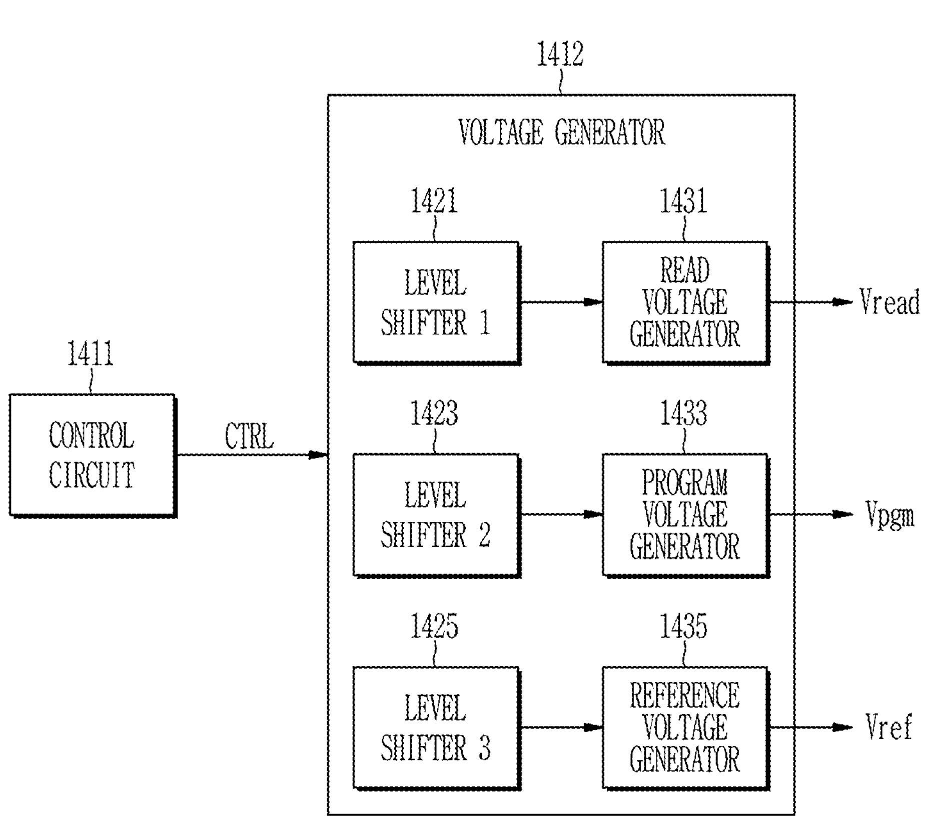
FIG. 15 is a schematic block diagram for explaining a level shifter in a voltage generator in FIG. 14.

FIG. 15 is a schematic block diagram for explaining the level shifter in the voltage generator in FIG. 14. For example, FIG. 15 is a diagram for explaining the operating method of the level shifter in the voltage generator 1412 of the memory device 1400.

In an exemplary embodiment, the voltage generator 1412 may generate various kinds of word line voltages to be supplied to the word lines WL in the memory cell array (see reference symbol "1414" in FIG. 14), based on the control signals CTRL of the control circuit 1411. The voltage generator 1412 may include a read voltage generator 1431 for generating a read voltage Vread to be transmitted to word lines WL, a programming voltage generator 1433 for generating a programming voltage Vpgm, and a reference voltage generator 1435 for generating a reference voltage Vref for an additional operation.

In an exemplary embodiment, the read voltage generator 1431, the programming voltage generator 1433, and the reference voltage generator 1435 in the voltage generator 1412 may use voltages with levels different from an external voltage. For example, the read voltage generator 1431, the programming voltage generator 1433, and the reference voltage generator 1435 may operate by receiving, as input voltages, voltages with levels higher than the external voltage. Accordingly, level shifters 1421, 1423, and 1425 may supply voltages with different levels to be provided to the read voltage generator 1431, the programming voltage generator 1433, and the reference voltage generator 1435, based on the external voltage. The level shifters 1421, 1423, and 1425 may be implemented by any of the previously described level shifters.

In an exemplary embodiment, the level shifters 1421, 1423, and 1425 include assist circuits for providing paths different from paths for pulling up the voltage levels of output voltages in response to input signals. In an exemplary embodiment, the level shifters 1421, 1423, and 1425 may more easily change the voltage levels of the output voltages by controlling transistors in the level shifters 1421, 1423, and 1425 through the paths different from the paths for pulling up the voltage levels of the output voltages in response to the input signals.

Figure 16:
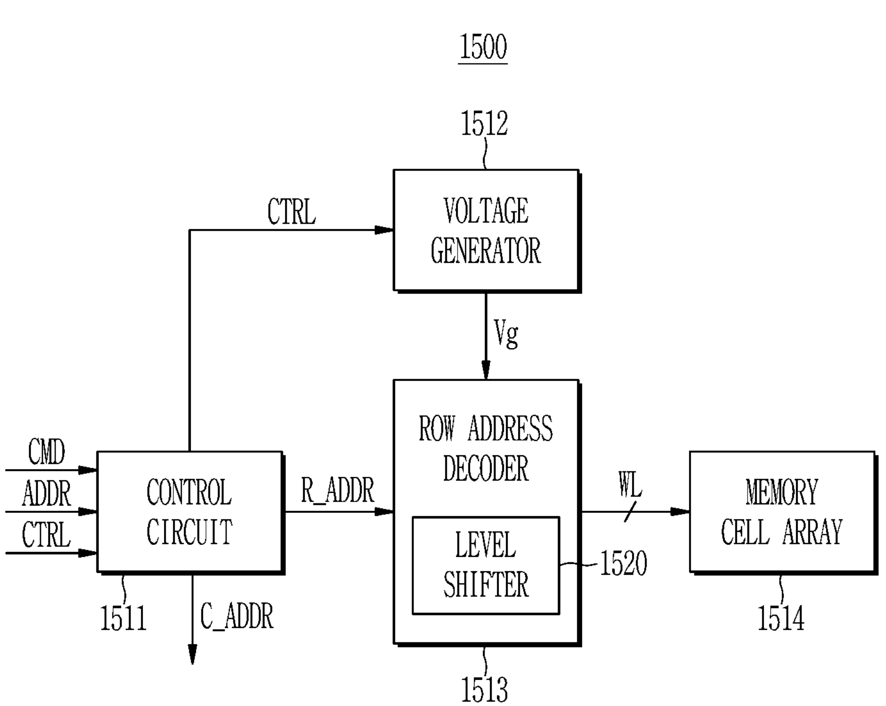
FIG. 16 is a schematic block diagram for explaining the memory device in FIG. 13.

FIG. 16 is a schematic block diagram for explaining the memory device in FIG. 13. A memory device 1500 may include a memory cell array 1514, a voltage generator 1512, a row address decoder 1513, and a control circuit 1511. However, the memory device 1500 may further include other constituent elements such as a column address decoder.

With respect to the memory device 1500, a description that duplicates the description of FIG. 14 will not be provided here.

In an exemplary embodiment, the row address decoder 1513 may be connected to the memory cell array 1514 through word lines WL. The row address decoder 1513 may select a row to be activated from a plurality of rows of the memory cell array 1514, on the basis of a row address R_ADDR. The row address decoder 1513 may receive a word line voltage Vg to be supplied to the word lines WL, from the voltage generator 1512, and apply the corresponding word line voltage to a word line WL corresponding to the row to be activated. In an exemplary embodiment, the row address decoder 1513 may include a level shifter 1520 according to an exemplary embodiment. The level shifter 1520 will be described below with reference to FIG. 17. The level shifter 1520 may be implemented by any of the previously described level shifters.

Figure 17:
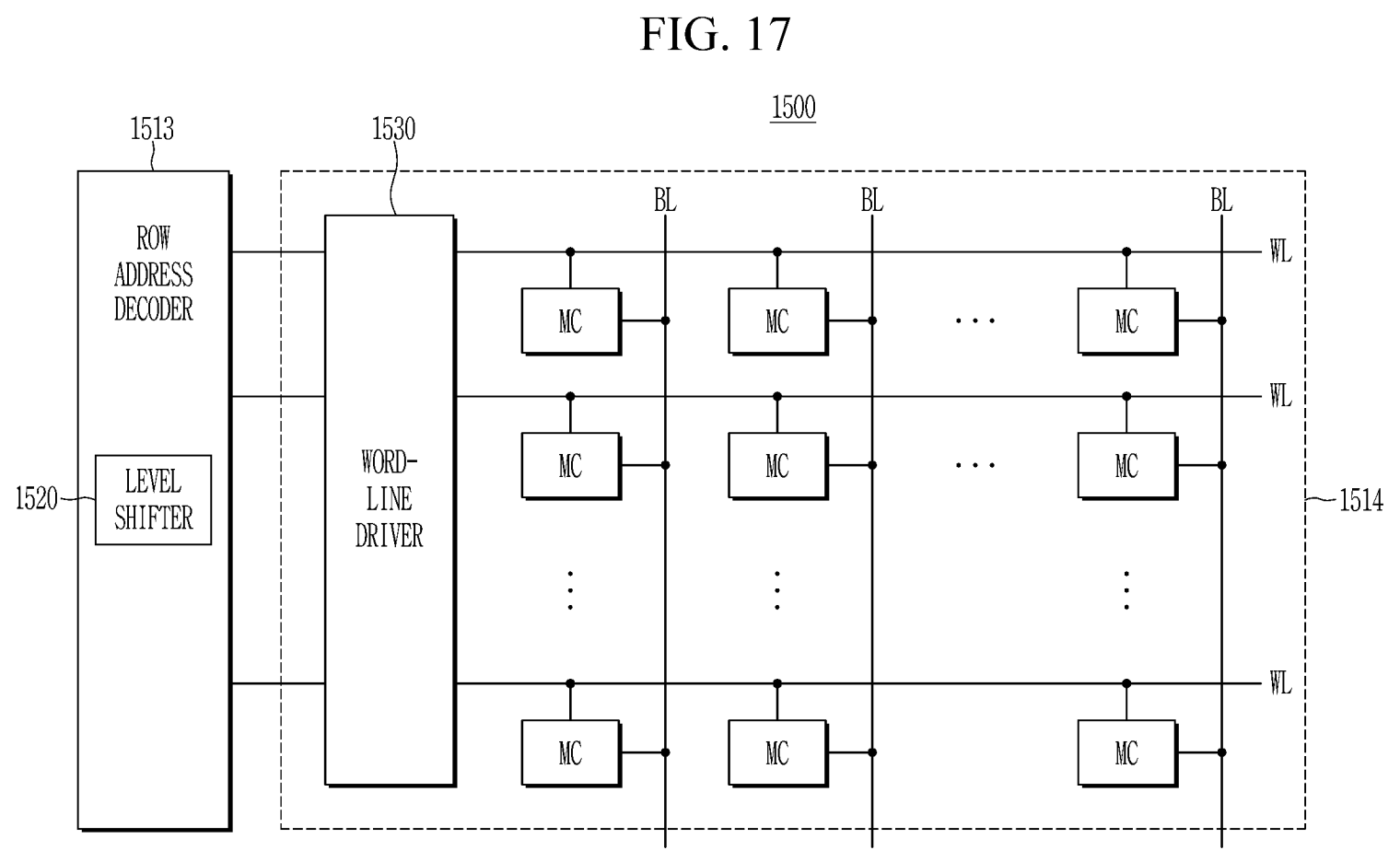

FIG. 17 is a schematic block diagram for explaining the level shifter in the row address decoder in FIG. 16. Specifically, FIG. 17 is a diagram for explaining the operating method of the level shifter in the row address decoder 1513 of the memory device 1500.

In an exemplary embodiment, the memory device 1500 may include the row address decoder 1513 and the memory cell array 1514. The memory cell array 1514 may include a plurality of memory cells MC. The memory cell array 1514 may include a plurality of rows, a plurality of columns. The plurality of memory cells MC may be arranged at the intersections of the plurality of rows and the plurality of rows. In an exemplary embodiment, the plurality of rows may be defined by a plurality of word lines WL, and the plurality of columns may be defined by a plurality of bit lines BL.

In an exemplary embodiment, the memory cell array 1514 may include a word line driver 1530. The word line driver 1530 may be connected to each of the plurality of word lines WL connected to the memory cells MC disposed in the memory cell array 1514. In other words, a word line WL is driven by the word line driver 1530, and when a bit line BL is selected, among the memory cells MC, one memory cell corresponding to the bit line can be accessed. In the exemplary embodiment, an access operation mode of the memory device 1500 includes a read operation and a programming operation.

In an exemplary embodiment, a plurality of memory cells MC connected to all or some of the word lines WL in the memory cell array 1514 may use voltages with levels different from the external voltage. The row address decoder 1513 may provide a voltage with a level different from the external voltage to the word line driver 1530, using the level shifter 1520. The output voltage generated by the level shifter 1520 may be provided to the word lines WL through the word line driver 1530.

In an exemplary embodiment, the level shifter 1520 may include assist circuits for providing paths different from paths for pulling up the voltage levels of output voltages in response to input signals. In an exemplary embodiment, the level shifter 1520 may more easily change the voltage level of the output voltage by controlling transistors in the level shifter 1520 through the paths different from the paths for pulling up the voltage level of the output voltage in response to the input signal.

While the inventive concept has been described in connection with what is presently considered to be exemplary embodiments thereof, it is to be understood that the inventive concept is not limited to the disclosed embodiments. On the contrary, it is intended to cover various modifications and equivalent arrangements included within the spirit and scope of the appended claims.

What is claimed is:

1. A level shifter comprising:

a first circuit configured to pull down a first output node and a first intermediate node based on an input signal, and pull down a second output node and a second intermediate node based on an inverted input signal of the input signal; and a second circuit configured to pull up the second output node to a supply voltage based on the first intermediate node when the first circuit pulls down the first output node, and pull up the first output node to the supply voltage based on the second intermediate node when the first circuit pulls down the second output node, wherein the second circuit comprises:

a first transistor comprising a drain terminal connected to a first node, a source terminal connected to the second intermediate node, and a gate configured to receive a first bias signal, a second transistor comprising a drain terminal connected to a line configured to apply the supply voltage, a source terminal connected to the first output node, and a gate connected to the first node, a third transistor comprising a drain terminal connected to the first intermediate node, a source terminal connected to a second node, and a gate configured to receive the first bias signal, and a fourth transistor comprising a drain terminal connected to the line configured to apply the supply voltage, a source terminal connected to the second output node, and a gate connected to the second node.

2. The level shifter of claim 1, wherein the first circuit comprises:

a fifth transistor connected between a line that applies a ground voltage and a third node, and includes a gate configured to receive the input signal; and a sixth transistor connected between the line that applies the ground voltage and a fourth node, and includes a gate configured to receive the inverted input signal.

3. The level shifter of claim 2, further comprising:

a third circuit configured to adjust upper limits of voltage levels of the first intermediate node and the second intermediate node to be equal to or lower than a first bias voltage, and adjust lower limits of voltage levels of the first output node and the second output node to be equal to or higher than a second bias voltage different from the first bias voltage.

4. The level shifter of claim 3, wherein the first bias voltage is lower than the supply voltage, and the second bias voltage is higher than the ground voltage.

5. The level shifter of claim 3, wherein the third circuit comprises:

a seventh transistor connected between the first intermediate node and the first third node, and includes a gate that is configured to receive the first bias voltage;

an eighth transistor connected between the second intermediate node and the fourth node, and includes a gate configured to receive the first bias voltage;

a ninth transistor connected between the first output node and the first intermediate node, and includes a gate configured to receive the second bias voltage; and a tenth transistor connected between the second output node and the second intermediate node, and includes a gate configured to receive the second bias voltage.

6. The level shifter of claim 1, further comprising:

a third circuit configured to pull up an output node configured to output an output signal, to the supply voltage, based on the voltage level of the first output node, and pull down the output node based on the inverted input signal.

7. The level shifter of claim 6, wherein the third circuit comprises:

a fifth transistor connected between a line that applies the supply voltage and a third node, and includes a gate connected to the first output node; and a sixth transistor connected between a line that applies a ground voltage and a fourth node, and includes a gate configured to receive the inverted input signal.

8. The level shifter of claim 7, wherein the third circuit further comprises:

a seventh transistor connected between the third node and the output node, and includes a gate configured to receive a first bias signal; and a eighth transistor connected between the output node and the fourth node, and includes a gate configured to receive a second bias signal different from the first bias signal.

9. The level shifter of claim 8, further comprising:

a ninth transistor that includes a gate configured to receive the first bias signal, is connected to the output node, and is configured to adjust a lower limit of a voltage level of the output node to be equal to or higher than a voltage level of the first bias signal.

10. The level shifter of claim 8, further comprising:

a tenth transistor that includes a gate configured to receive the second bias signal, is connected to the output node, and is configured to adjust an upper limit of the voltage level of the output node to be equal to or lower than the voltage level of the second bias signal.

11. The level shifter of claim 1, further comprising:

a third circuit configured to pull up an output node that is configured to output an output signal, to the supply voltage, based on a voltage level of the second output node, and pull down the output node based on the input signal.

12. The level shifter of claim 1, further comprising:

a third circuit configured to pull up the second output node to the supply voltage based on a voltage level of the first output node, and pull up the first output node to the supply voltage based on a voltage level of the second output node.

13. A memory device comprising:

a row address decoder including a level shifter configured to:

generate an output signal by pulling up a voltage level of a first node to a first voltage level different from a voltage level of a first input signal by a pull-up current flowing through a first path, when receiving a first input signal;

shut off the pull-up current by a first driving current flowing through a second path different from the first path, when receiving a second input signal which is an inverted signal of the first input signal; and pull down the voltage level of a first node to a second voltage level different from the first voltage level by a second driving current flowing through a third path, when receiving the second input signal and shutting off the pull-up current; and a memory cell array including a word line configured to receive the output signal, and a plurality of memory cells connected to the word line, wherein the first driving current and the second driving current are configured to minimize a current fighting between the pull-up current and a pull-down current.

14. The memory device of claim 13, wherein the level shifter is configured to pull up the voltage level of the first node to the first voltage level by a fourth current flowing through a fourth path, when receiving the first input signal.

15. The memory device of claim 14, wherein the first driving current also configured to shut off the fourth current.

* * * * *